(12) United States Patent
Darwish

(10) Patent No.: US 7,843,004 B2
(45) Date of Patent: Nov. 30, 2010

(54) POWER MOSFET WITH RECESSED FIELD PLATE

(75) Inventor: Mohamed N. Darwish, Campbell, CA (US)

(73) Assignee: MaxPower Semiconductor Inc., Santa Clara, CA (US)

( * ) Notice: Subject to any disclaimer, the term of this patent is extended or adjusted under 35 U.S.C. 154(b) by 388 days.

(21) Appl. No.: 11/903,972

(22) Filed: Sep. 25, 2007

(65) Prior Publication Data

US 2008/0073707 A1    Mar. 27, 2008

Related U.S. Application Data

(60) Provisional application No. 60/847,551, filed on Sep. 27, 2006.

(51) Int. Cl.
*H01L 29/66* (2006.01)

(52) U.S. Cl. .............. 257/341; 257/329; 257/E29.131; 257/E29.183; 257/E29.189; 370/466

(58) Field of Classification Search ................. 257/328, 257/330, E29.131, E29.183, E29.189, E29.201, 257/E29.257; 370/466
See application file for complete search history.

(56) References Cited

U.S. PATENT DOCUMENTS

| | | | |
|---|---|---|---|
| 5,879,980 A | 3/1999 | Selcuk et al. ............... 438/238 |
| 5,907,776 A | 5/1999 | Hshieh et al. | |
| 6,388,286 B1 | 5/2002 | Baliga ......................... 257/330 |
| 6,429,481 B1 | 8/2002 | Mo et al. | |
| 6,521,497 B2 | 2/2003 | Mo | |
| 6,710,403 B2 | 3/2004 | Sapp | |
| 6,710,406 B2 | 3/2004 | Mo et al. | |
| 6,828,195 B2 | 12/2004 | Mo et al. | |
| 6,833,584 B2 | 12/2004 | Henninger et al. .......... 257/334 |
| 2005/0167742 A1* | 8/2005 | Challa et al. ................. 257/328 |
| 2005/0208722 A1 | 9/2005 | Peake et al. .................. 438/259 |
| 2006/0060916 A1* | 3/2006 | Girdhar et al. .............. 257/330 |
| 2006/0209887 A1* | 9/2006 | Bhalla et al. ................. 370/466 |

* cited by examiner

*Primary Examiner*—Kenneth A Parker
*Assistant Examiner*—Fang-Xing Jiang
(74) *Attorney, Agent, or Firm*—Groover & Associates

(57) ABSTRACT

A trench MOSFET contains a recessed field plate (RFP) trench adjacent the gate trench. The RFP trench contains an RFP electrode insulated from the die by a dielectric layer along the walls of the RFP trench. The gate trench has a thick bottom oxide layer, and the gate and RFP trenches are preferably formed in the same processing step and are of substantially the same depth. When the MOSFET operates in the third quadrant (with the source/body-to-drain junction forward-biased), the combined effect of the RFP and gate electrodes significantly reduces in the minority carrier diffusion current and reverse-recovery charge. The RFP electrode also functions as a recessed field plates to reduce the electric field in the channel regions when the MOSFET source/body to-drain junction reverse-biased.

27 Claims, 29 Drawing Sheets

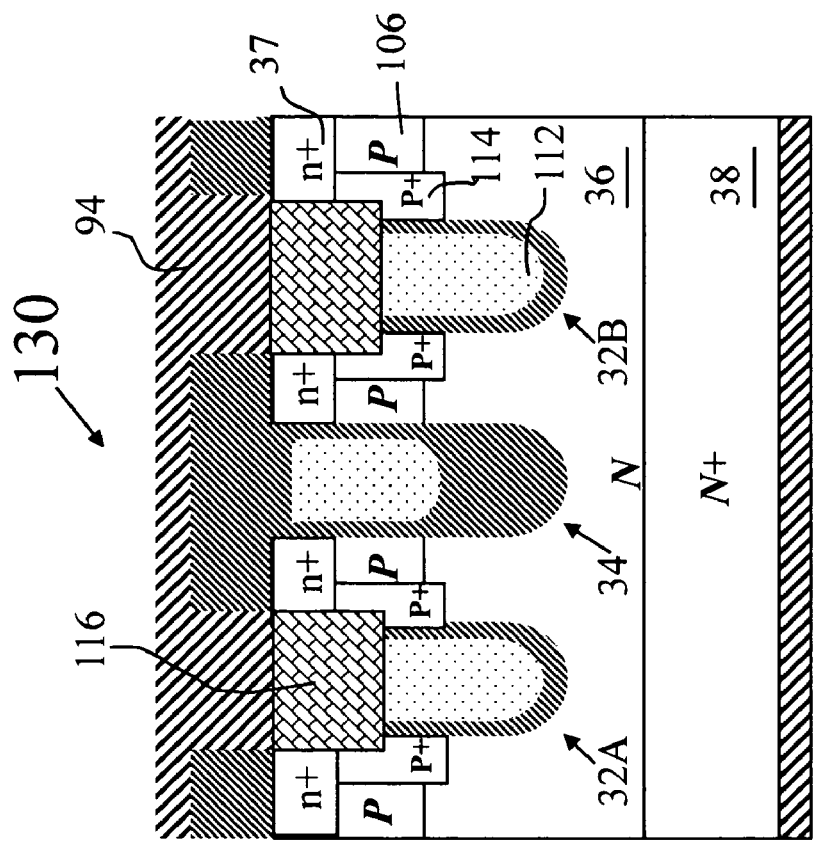
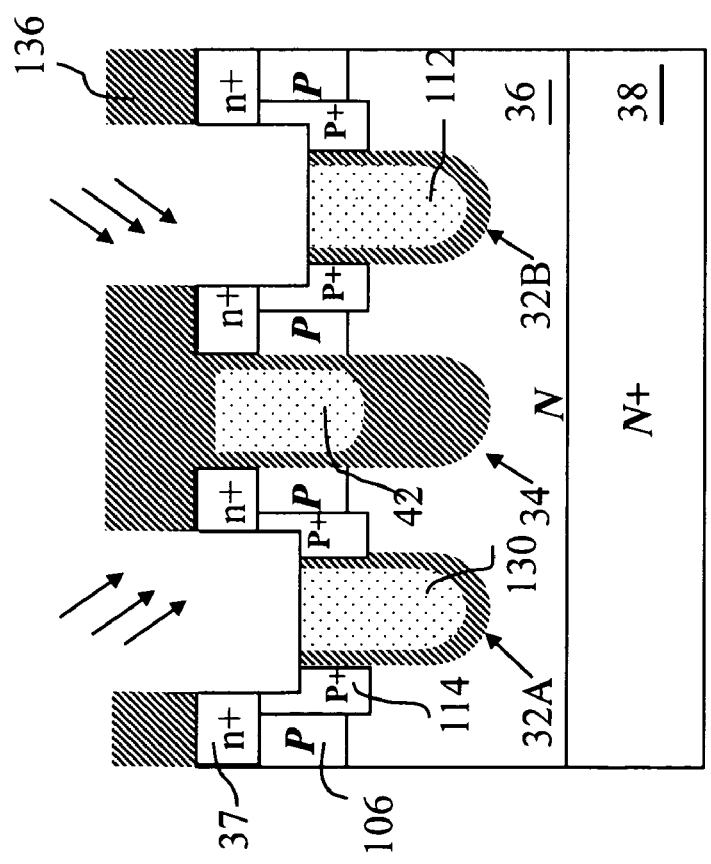
Fig. 15A
Fig. 15B

POWER MOSFET WITH RECESSED FIELD PLATE

CROSS-REFERENCE TO RELATED APPLICATIONS

This application claims the priority of Provisional Application No. 60/847,551, filed Sep. 27, 2006, which is incorporated herein by reference in its entirety.

BACKGROUND OF THE INVENTION

Power MOSFETs are widely used as switching devices in many electronic applications. In order to minimize conduction power loss it is desirable that power MOSFETs have a low specific on-resistance, which is defined as the product of the on-resistance (Ron) of the MOSFET multiplied by the active die area (A) of the MOSFET (Ron*A). A trench-type MOSFET, as shown in the schematic cross-sectional view of a MOSFET 10 in FIG. 1, provides a low specific on-resistance because of its high packing density or number of cells per unit area. As the cell density increases, the associated capacitances, such as the gate-to-source capacitance (Cgs), the gate-to-drain capacitance (Cgd), and the drain-to-source capacitance (Cds), also increase. In many switching applications such as the synchronous buck dc-dc converters used in mobile products, MOSFETs with a breakdown voltage in the range of 12 to 30V are required to operate at switching frequencies approaching 1 MHz. Therefore, it is desirable to minimize the switching or dynamic power loss caused by these capacitances. The magnitudes of these capacitances are directly proportional to the gate charge (Qg), the gate-drain charge (Qgd), and output charge (Qoss). Furthermore, when these devices operate in the third quadrant, i.e. where the drain-body junction is forward-biased, charge is stored as a result of minority carrier injection, and this stored charge causes a delay in switching speed of the device. It is therefore critical that a MOSFET switch have a low reverse recovery charge (Qrr).

U.S. Pat. No. 6,710,403 to Sapp proposes a dual-trench power MOSFET, as shown in FIG. 2, with two deeper polysilicon-filled trenches 22 on either side of an active trench 24, to lower the levels of Ron, Cgs and Cgd. However, MOSFET 20 does not lower the reverse recovery charge Qrr and requires the fabrication of trenches having two different depths. Furthermore, in MOSFET 20 the deep and shallow trenches are not self-aligned, which causes variations in mesa widths and hence in breakdown voltages.

As the switching-speed requirements increase to 1 MHz and above, driven by new applications such as CPU voltage regulator module (VRM), power MOSFETs are becoming increasingly unable to operate with satisfactory efficiency performance and power loss. Therefore, there is a clear need for a power MOS transistor that has low gate charges Qg and Qgd, a low output charge Qoss and a low reverse-recovery charge Qrr, in addition to having a low specific on-resistance (Ron*A).

BRIEF SUMMARY OF THE INVENTION

A MOSFET according to the invention is formed in a semiconductor die and comprises a gate trench and a recessed field plate (RFP) trench that are self-aligned, both trenches extending from a surface of the die and forming a mesa between them. The gate trench comprises a gate electrode separated from the die by a first dielectric layer having a thick section at the bottom of the gate trench and extends to substantially the same depth as the RFP trench. The RFP trench contains an RFP electrode separated from the die by a second dielectric layer. The MOSFET also comprises a source region of a first conductivity type adjacent the surface of the die and a sidewall of the gate trench and adjacent to the RFP electrode trench in some areas of the MOSFET and a body region of a second conductivity type opposite to the first conductivity type adjacent the sidewall of the gate trench and the source region. In some areas of the MOSFET, a p+ body contact region may be placed laterally adjacent to the P− body. The RFP electrode may be independently biased or may be biased at the source potential In one embodiment, the respective depths of the gate and RFP trenches are substantially the same.

The invention also comprises a method of fabricating a MOSFET. The method comprises providing a semiconductor die; etching the die so as to form a gate trench and a recessed field plate (RFP) trench, the gate trench and the RFP trench extending from a surface of the die and being of substantially equal depth; forming an insulating layer at a bottom of the gate trench; forming a gate dielectric layer on a sidewall of the gate trench above the insulating layer; forming a second dielectric layer along the walls of the RFP trench; introducing conductive material into the gate trench to form a gate electrode; introducing conductive material into the RFP trench to form an RFP electrode; implanting dopant of a second conductivity type opposite to the first conductivity type to form a body region in the mesa adjacent the sidewall of the gate trench; implanting dopant of a first conductivity type to form a source region adjacent the surface of the die in the mesa; and depositing a source contact layer on the surface of the die in contact with the source region.

BRIEF DESCRIPTION OF THE SEVERAL VIEWS OF THE DRAWING

FIGS. 15A and 15B illustrate a variation of the process shown in FIGS. 14A-14H.

DETAILED DESCRIPTION OF THE INVENTION

Figure 2:
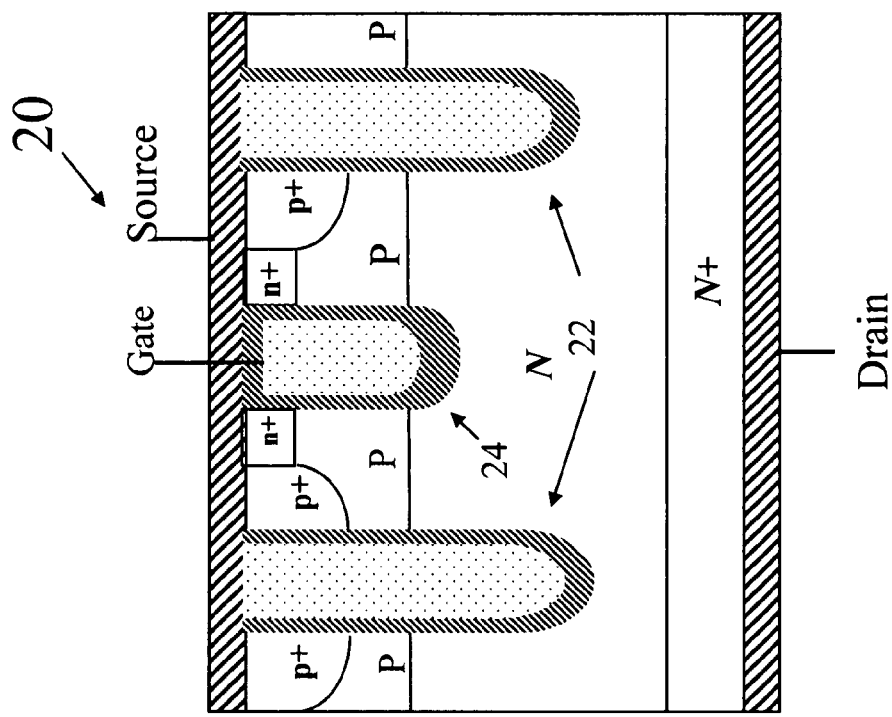
FIG. 2 is a cross-sectional view of a known dual-trench MOSFET.
Figure 1:
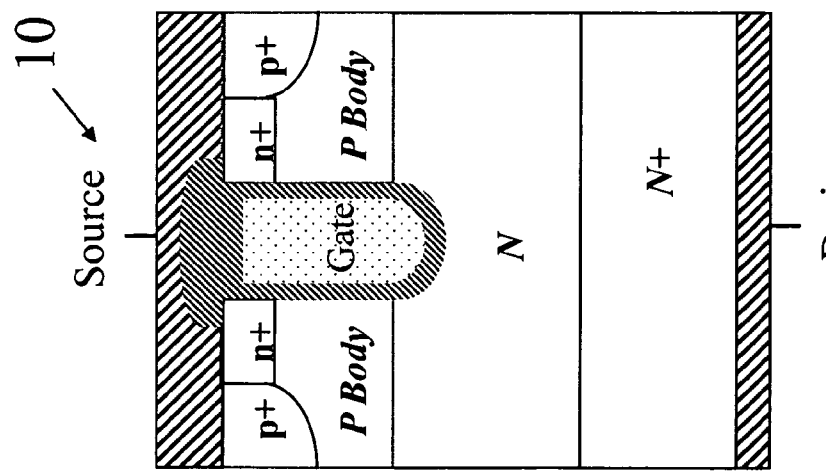
FIG. 1 is a cross-sectional view of a conventional trench-type MOSFET.
Figure 3A:
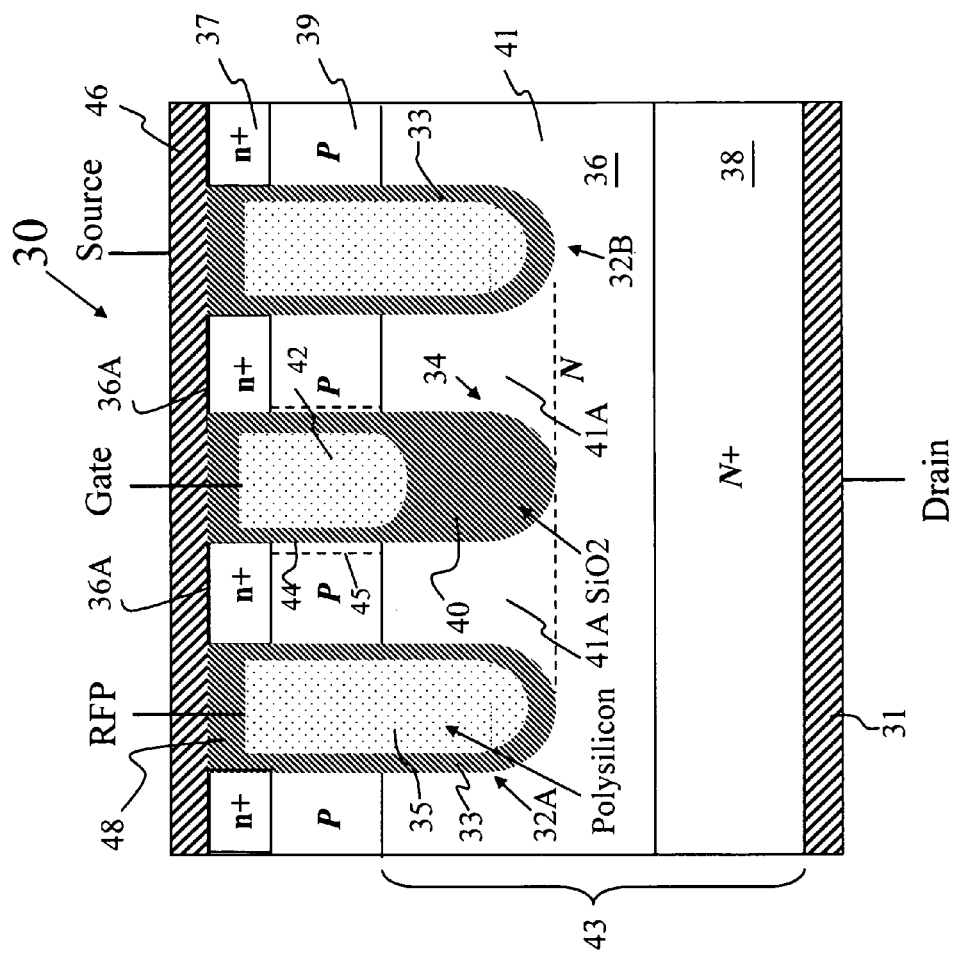
FIG. 3A is a cross-sectional view of a MOSFET having a recessed field plate (RFP) in accordance with the invention, with the recessed field plate (RFP) electrode independently biased.

A basic cell of an n-channel MOSFET 30 in accordance with this invention is shown in FIG. 3A. MOSFET 30 is formed in a semiconductor die comprising an n-type epitaxial layer 36 that is grown over a heavily doped n+ substrate 38. MOSFET 30 includes recessed field plate (RFP) trenches 32A and 32B located on either side a gate trench 34 in the n-type epitaxial layer 36. Unlike the trenches in the MOSFET 20 shown in FIG. 2, the thick bottom oxide of the gate trench 34 extends to substantially the same depth as the RFP trenches 32A and 32B. Furthermore, the RFP trenches 32A and 32B and the gate trench 34 are preferably formed in the same processing step and therefore are self-aligned (i.e., the RFP trenches 32A and 32B are equally spaced from gate trench 34 regardless of processing and alignment variations), and RFP trenches 32A and 32B and gate trench 34 are of equal or substantially equal depth (e.g., the respective depths of RFP trenches 32A and 32B are within +/−10%, or preferably +/−5%, of the depth of gate trench 32). The mesas between the trenches contain n+ source regions 37 and p-body regions 39, and below p-body regions 39 is an n-type drain-drift region 41 of epitaxial layer 36. The drain-drift region 41 includes areas 41A between RFP trenches 32A and 32B and gate trench 34. The drain-drift region 41 and the n+ substrate 38 together form the drain 43 of MOSFET 30.

In the prior art MOSFET 20 shown in FIG. 2, when the body-drain junction is reverse-biased, the electric field strength is reduced and hence the breakdown voltage is increased due to the spread of the depletion region between the two deep trenches 22, mainly in the drift region below the gate trench 24. In MOSFET 30, under the same conditions the electric field is further reduced because the depletion layer is initially limited to the narrower areas 41A of drain-drift region 41 located between the thick oxide of the gate trench 34 and RFP trenches 32A and 32B. Moreover, since the trenches 22 in the prior art MOSFET 20 are deeper than the gate trench 24, the electric field at the bottom of trenches 22 is higher, which sets a lower limit on the thickness of the oxide layer in trenches 22. This limitation degrades the effectiveness of the trenches 22 in reducing the electric field in the channel of MOSFET 20.

Referring again to FIG. 3A, the walls of trenches 32A and 32B are lined with a layer 33 of an insulating material such as silicon dioxide ($SiO_2$) and trenches 32A and 32B contain RFP electrodes 35, each of which comprises a layer of a conductive material such as n-type or p-type doped polysilicon. The oxide layer 33 preferably has a breakdown voltage that exceeds the breakdown voltage of MOSFET 30. The gate trench 34 is filled with a layer 40 of insulating material up to the level of the p-n junctions between p-body regions 39 and the drain-drift region 41 of epitaxial layer 36. Above insulating layer 40 is a gate electrode 42, which may be formed of n-type doped polysilicon and which is separated from epitaxial layer 36 by a gate dielectric layer 44. Channel regions 45 (represented by the dashed lines) lie within the p-body regions 39 adjacent the gate dielectric layer 44. The thickness of insulating layer 40 is preferably set so as to minimize the overlap of the gate electrode 42 and the drain-drift region 41. An overlying source contact layer 46 contacts n+ source regions 37, and a drain contact layer 31 contacts n+ substrate 38. Contact layers 46 and 31 are typically formed of a metal although they could also be formed of another conductive material.

The RFP electrodes 35 in RFP trenches 32A and 32B extend to a level that is deeper below the surface 36A of epitaxial layer 36 than the bottom of gate electrode 42. RFP electrodes 35 may be independently biased or, as shown in FIG. 3B, may be connected to n+ source regions 37 outside the plane of the drawing.

In some embodiments, the doping concentration of the drain-drift region 41 in the areas between the RFP trenches 32A and 32B and the gate trench 34 is less (e.g., $5\times10^{15}$ to $1.5\times10^{16}$ $cm^{-3}$) than the doping concentration of the drain-drift region 41 in the area below the gate trench 34 (e.g., $2\times10^{16}$ to $3\times10^{16}$ $cm^{-3}$). This structure improves depletion-spreading in the areas of drain-drift region 41A between the RFP trenches 32A and 32B and the gate trench 34 when the PN junction between the body region 39 and the drain-drift region 41 is reverse-biased due to the limited depletion charge in region 41A. This can be further improved, for example, by varying the doping of epitaxial layer 36 as it is being formed. It also results in shorter channel length, which in turn provides a lower Ron, a lower gate-to-source capacitance (Cgs), and a lower gate-to-drain capacitance (Cgd)

Figure 3B:
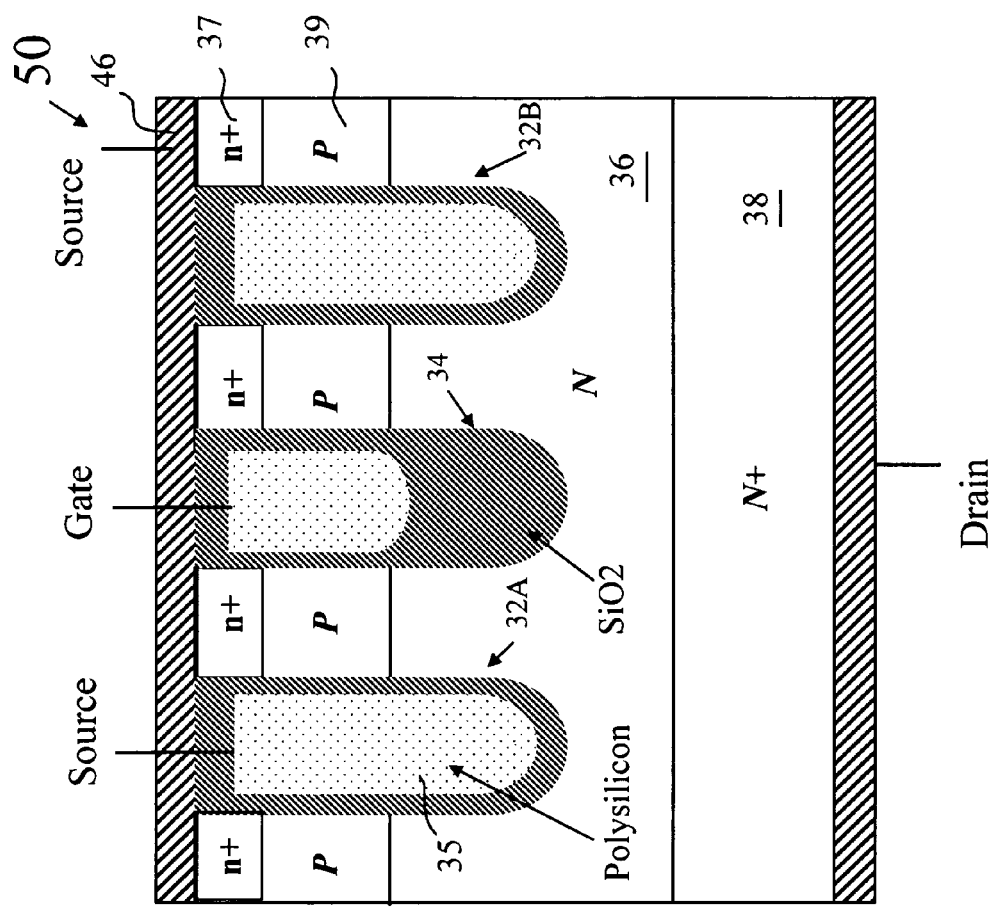
FIG. 3B is a cross-sectional view of a MOSFET having a recessed field plate (RFP) in accordance with the invention, with the RFP electrode biased at the same potential as the source.
Figure 4A:
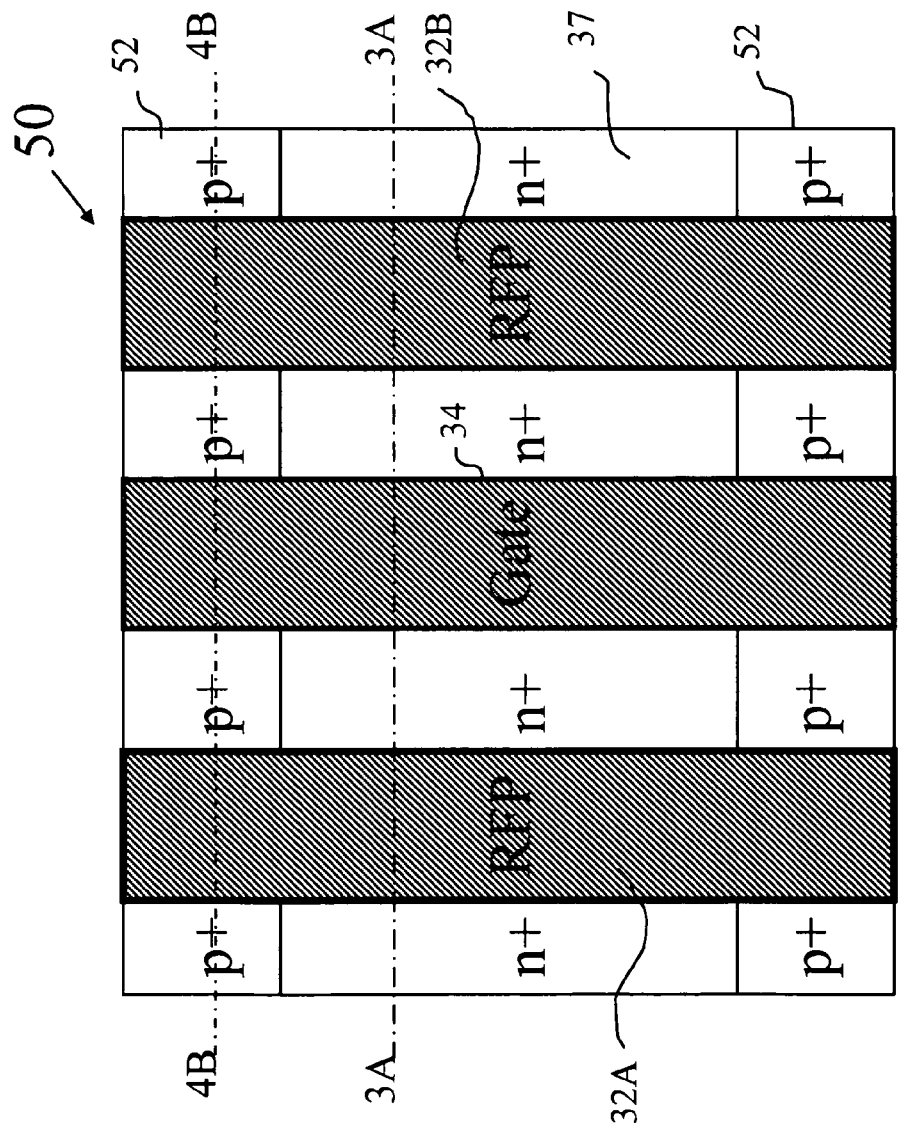
FIG. 4A is a top view of the MOSFET shown in FIG. 3A.
Figure 4B:
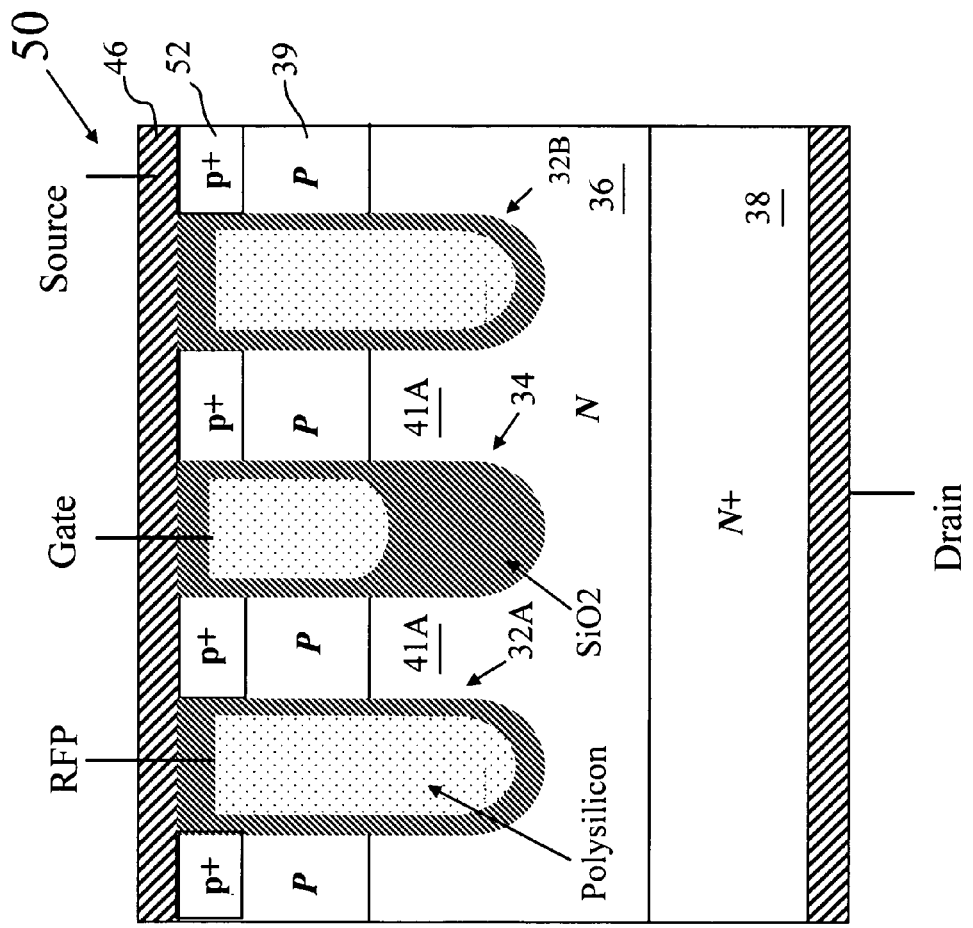
FIG. 4B is a cross-sectional view of the MOSFET shown in FIG. 3A, taken at cross-section 4B-4B in FIG. 4A.

In the embodiments shown in FIGS. 3A and 3B, n+ source regions 37 extend between the gate trench 34 and the RFP trenches 32A and 32B. Alternatively, a MOSFET 50, shown in the top view of FIG. 4A and the cross-sectional view of FIG. 4B, is similar to MOSFET 30, but in selected areas the n+ source regions 37 are replaced by p+ body contact regions 52 so as to avoid snap-back or second breakdown characteristics. In FIG. 4A, the view at cross-section 3A-3A is identical to cross-sectional view shown in FIG. 3A, and the view at cross-section 4B-4B is shown in FIG. 4B.

When a conventional N-channel MOSFET operates in the third quadrant, its drain is negatively biased with respect to its source-body electrode, and the diffusion current results in minority carrier injection and a high Qrr. In MOSFETs 30 and 50, because the n+ source regions 37 extend all the way across the mesa between the gate trench 34 and the RFP trenches 32A and 32B, the RFP electrodes 35 provide a majority carrier channel current path from drain to source in addition to that provided by the gate electrode in the conventional structure. The combined effect of the RFP and gate electrodes results in a significant reduction in the minority carrier diffusion current and reverse recovery charge Qrr than in conventional structures. In other words, in the third quadrant operation the RFP electrode acts as an additional gate without the penalty of the added gate-drain capacitance (Cgd) and gate-source capacitance (Cgs).

The RFP electrodes 35 also function as a recessed field plates to reduce the electric field in the channel regions 45 when MOSFETs 30 and 50 are reverse-biased. This effect enables the use of shorter channel lengths, without concern about punchthrough breakdown, and this results in a lower specific on-resistance (Ron*A) and a lower gate charge (Qg). Unlike MOSFET 20, the drift regions 41A below p− body regions 39 are constrained between the thick gate bottom oxide and the RFP electrode and are therefore more effectively depleted. Therefore, a deeper depletion layer results for the same reverse bias body-drain junction conditions, and a shorter channel can be used, resulting in a lower on-resistance. Furthermore, because the gate-to-drain capacitance (Cgd) drops at a faster rate with applied drain-source voltage Vds, a lower gate-drain charge Qgd and a better Ron-Qgd trade-off are realized. In other words, the combined effect of the RFP electrodes 35 and of having the gate trench 34 filled with insulating layer 40 up to the junctions between the p-body regions 39 and the drain-drift region 41 helps to deplete area of the drain-drift region 36 between the trenches 32A, 32B and 34 at a higher rate as the drain-source voltage Vds is increased while MOSFETs 30 and 50 are in the off-state. Therefore, a lower gate-drain charge (Qgd) results because of the low gate-to-drain capacitance (Cgd) and its fast falling rate with increasing Vds. Furthermore, the doping in the p-body regions 39 can be adjusted to obtain a lower threshold voltage at the same breakdown or punchthrough voltage. The doping in the p-body regions 39 can be further adjusted so that the p-body regions 39 are fully depleted, which significantly reduces gate charge Qg.

Figure 5A:
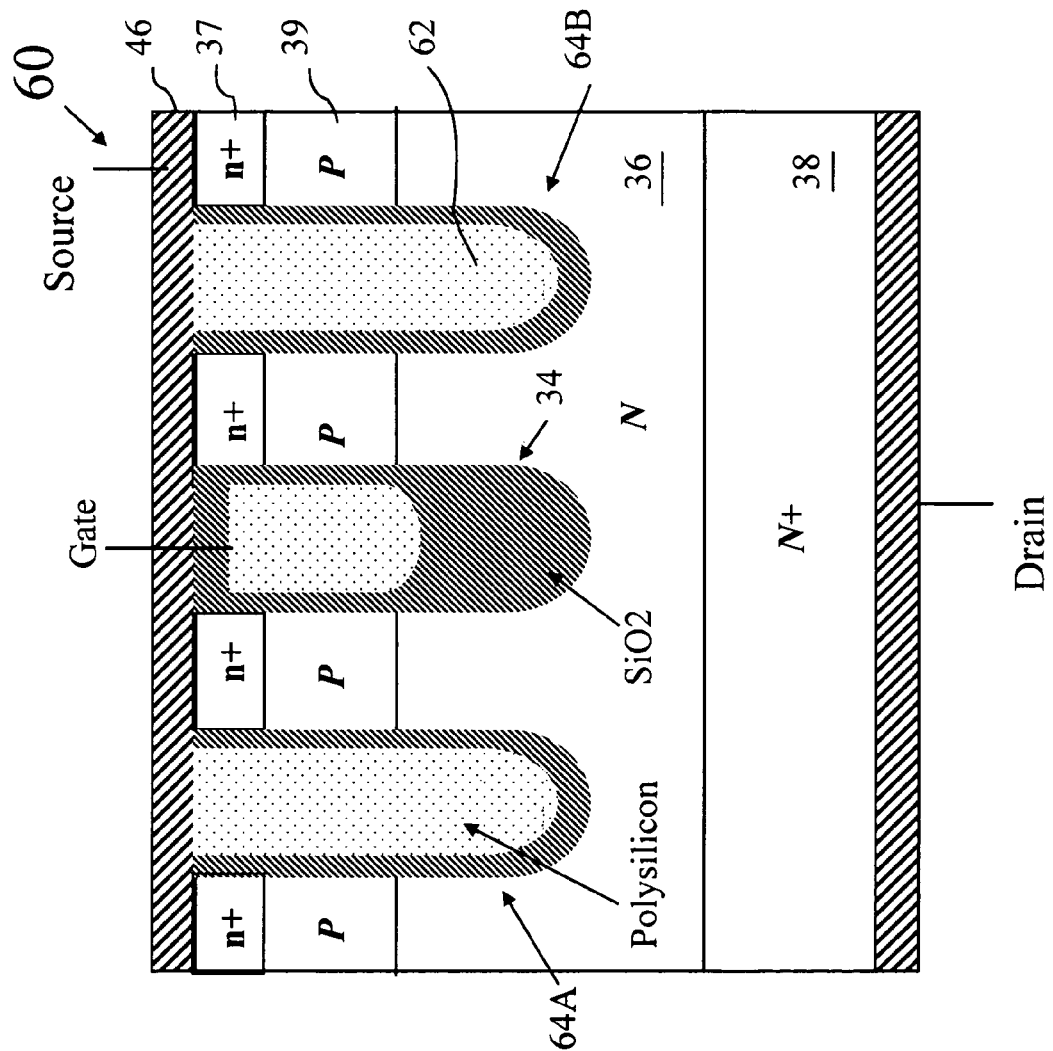
FIG. 5A is a cross-sectional view of an alternative embodiment wherein the RFP electrode is in contact with the source region.
Figure 5B:
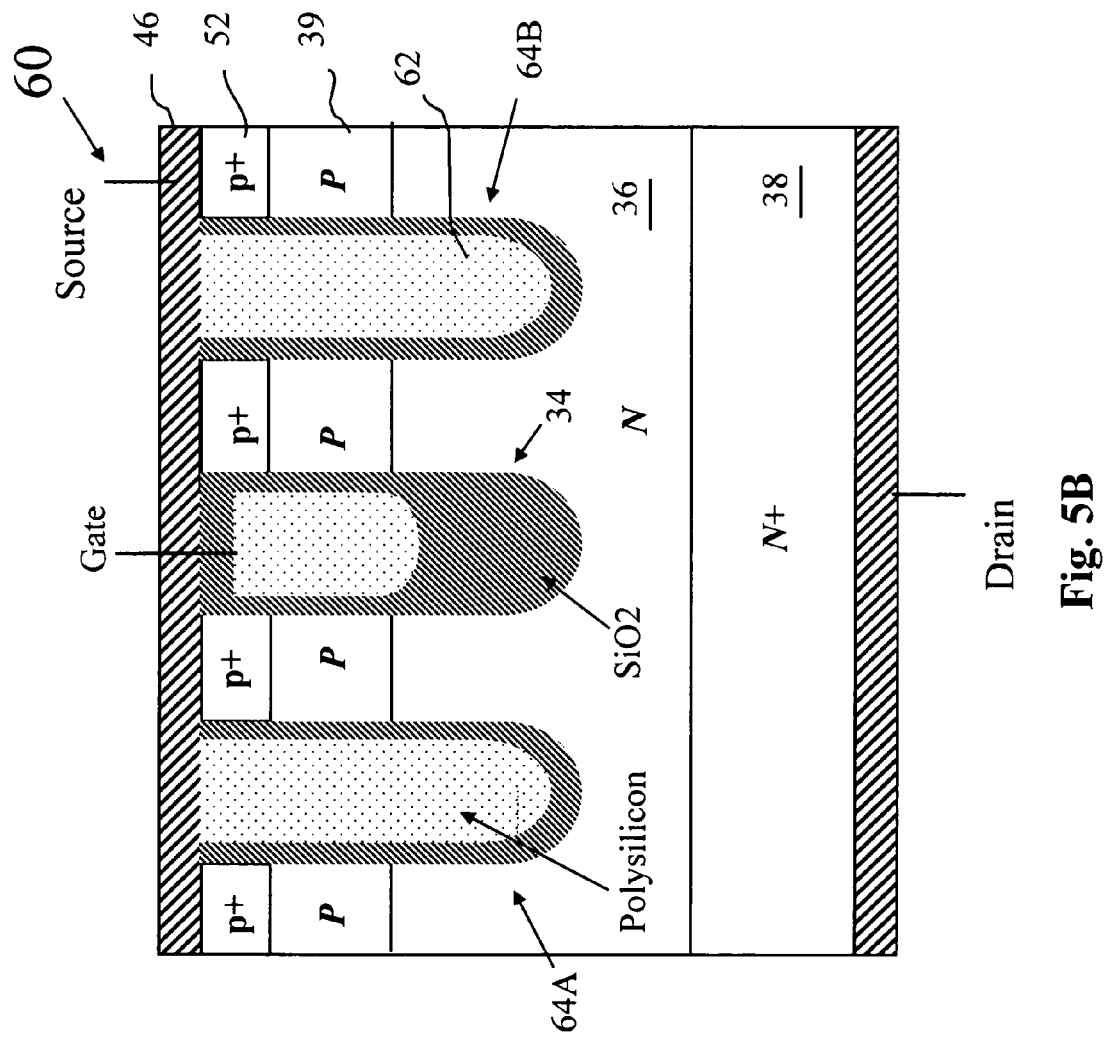
FIG. 5B is a cross-sectional view of the MOSFET of FIG. 5A taken at a cross-section corresponding to cross-section 4B-4B in FIG. 4A.

In MOSFET 30 shown in FIGS. 3A and 3B, the RFP electrodes 35 are separated from the source contact layer 46 by an insulating layer 48. Alternatively, in a MOSFET 60, shown in FIGS. 5A and 5B, there is no insulating layer 48, and RFP electrodes 62 in RFP trenches 64A and 64B extend upward to electrically contact the source contact layer 46. FIG. 5A is a view taken at a cross-section corresponding to cross-section 3A-3A in FIG. 4A; FIG. 5B is a view taken at a cross-section corresponding to cross-section 4B-4B in FIG. 4A

Figure 6A:
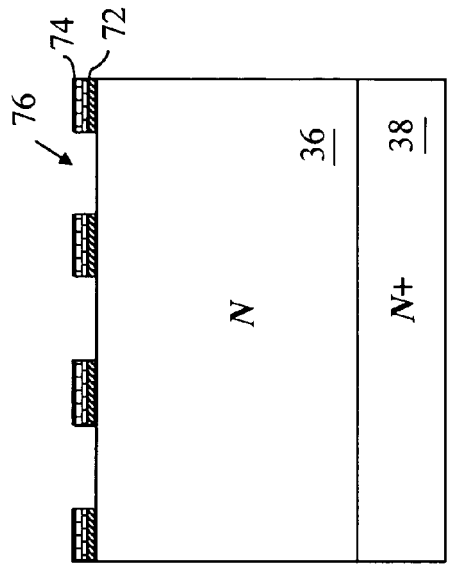
FIGS. 6A-6H illustrate a process of fabricating the MOSFET shown in FIG. 3A.

An exemplary process for fabricating MOSFET 30 of FIG. 3A is shown in FIGS. 6A-6H. As shown in FIG. 6A, the starting material is the heavily-doped n+ substrate 38, which may be doped, for example, with phosphorus or arsenic. The n-type epitaxial layer 36 is grown on top of the n+ substrate 38. A thin oxide layer 72 is grown over the n-type epitaxial layer 36, and a silicon nitride layer 74 is deposited on top of the oxide layer 72. For example, the oxide layer 72 can be 200-300 A thick, and the silicon nitride layer 74 can be 1000 A thick.

Figure 6B:
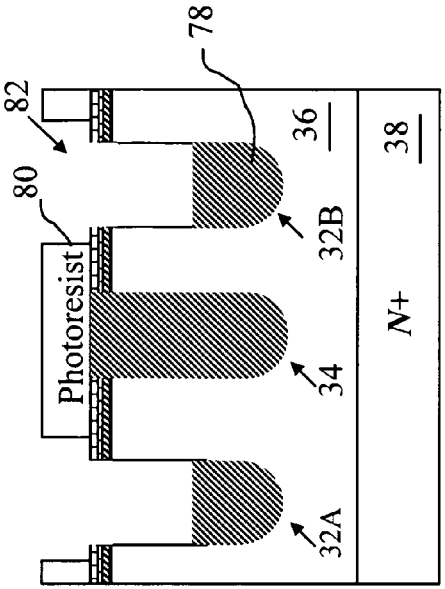

A photoresist mask (not shown) is used to pattern the silicon nitride layer 74 and oxide layer 72 with openings 76, as shown in FIG. 6B.

Figure 6C:
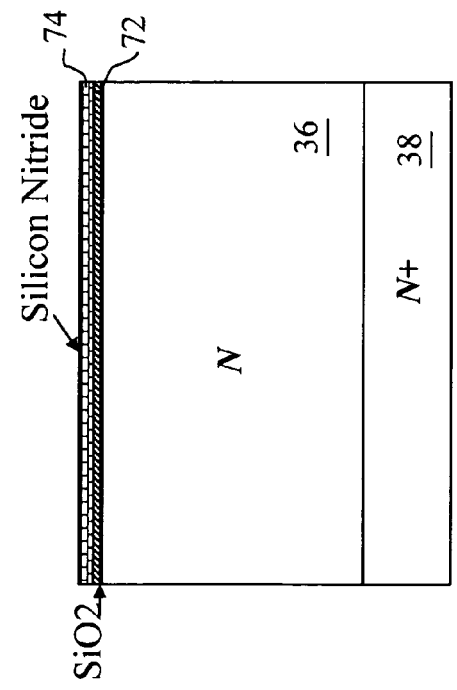

The epitaxial layer 36 is etched through the openings 76 to form the RFP trenches 32A and 32B and the gate trench 34, as shown in FIG. 6C. It will be understood that trenches 32A, 32B and 34 are illustrative only; typically numerous trenches would be formed. A thin thermal oxide layer (not shown), for example, 300 A thick, is grown on the walls of trenches 32A, 32B and 34, and trenches 32A, 32B and 34 are then filled with a layer 78 of deposited silicon dioxide such as LTO or TEOS or high density plasma (HDP) oxide. The resulting structure is shown in FIG. 6C.

Figure 6D:
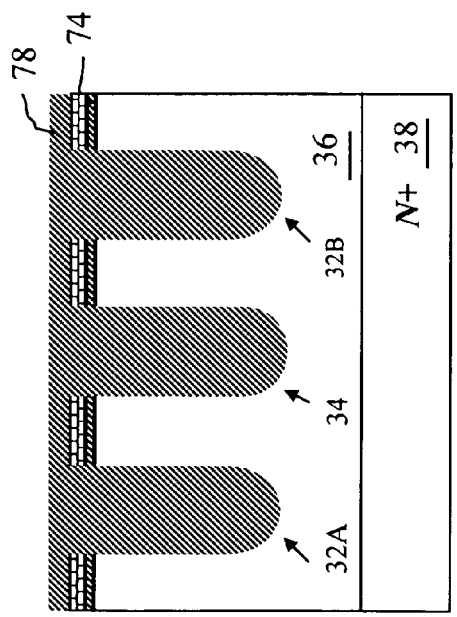

The oxide layer 78 is etched back using a dry plasma etch or chemical-mechanical polishing (CMP) technique to a level the same as or slightly below the top surface of the silicon nitride layer 74. A photoresist mask layer 80 is deposited and patterned to form openings 82 over the RFP trenches 32A and 32B, as shown in FIG. 6D, and the oxide layer 78 in the RFP trenches 32A and 32B is then completely or partially etched through the openings 82 by a wet or a dry plasma etch or a combination of wet and dry etching to yield the structure shown in FIG. 6D. Silicon nitride layer 74 prevents epitaxial layer 36 from being etched.

Figure 6E:
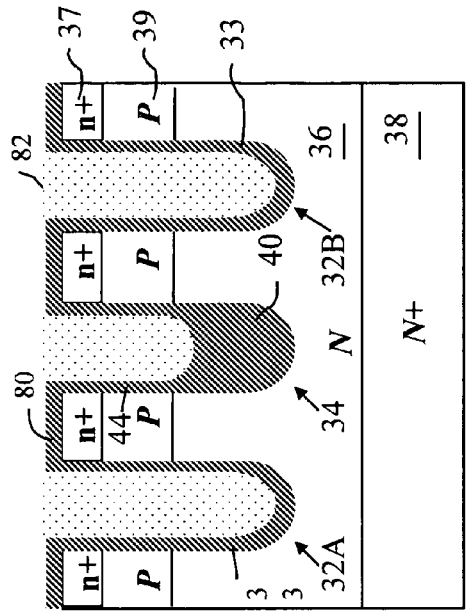

The photoresist mask layer 80 is removed and the portion of oxide layer 78 remaining in the gate trench 34 is partially etched by wet etching. At the same time, the remaining portion of oxide layer 78 at the bottom of the RFP trenches 32A and 32B is removed. This is followed by an etch to remove the silicon nitride layer 74 and a wet oxide etch to remove the oxide layer 72 and any remaining oxide on the walls of the RFP trenches 32A and 32B. The resulting structure is shown in FIG. 6E.

Figure 6F:
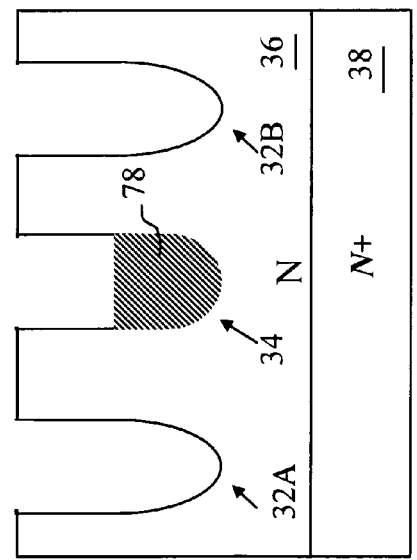

As shown in FIG. 6F, a thermal process is then performed to form oxide layer 33 on the walls of the RFP trenches 32A and 32B and gate dielectric layer 44 on the walls of the gate trench 34 above the remaining portion of the oxide layer 78 (which forms the insulating layer 40 at the bottom of the gate trench 34). This process also creates an oxide layer 80 on the top surface of the epitaxial layer 36. These oxide layers could have a thickness, for example, in the range of 200 A to 1000 A. A layer 82 of polysilicon is then deposited and then doped, for example, by implanting with an n-type dopant such as phosphorus and then etched back to a level at or below that of the surface of oxide layer 80 by a plasma dry etching or CMP technique. Several masking and implant steps are performed to form the p-body regions 39 and p+ body contact regions 52 (shown in FIGS. 4A and 4B), using a p-type dopant such as boron, and to form the n+ source regions 37, using an n-type dopant such as arsenic or phosphorus or a combination thereof. A deep p layer (not shown) may also be implanted at this step or earlier in the process.

Figure 6G:
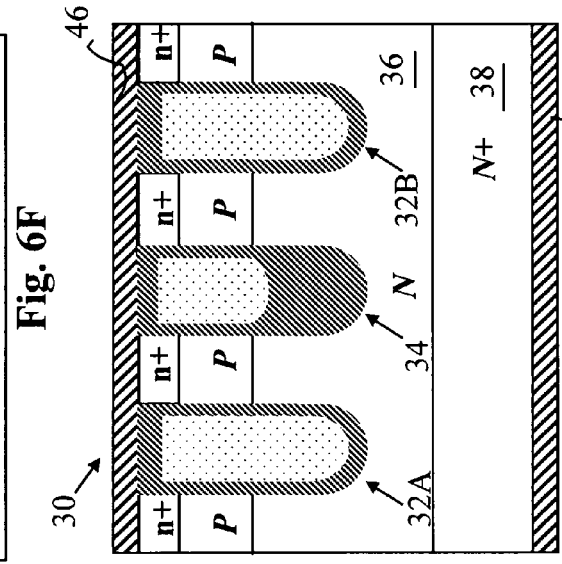
Figure 6H:
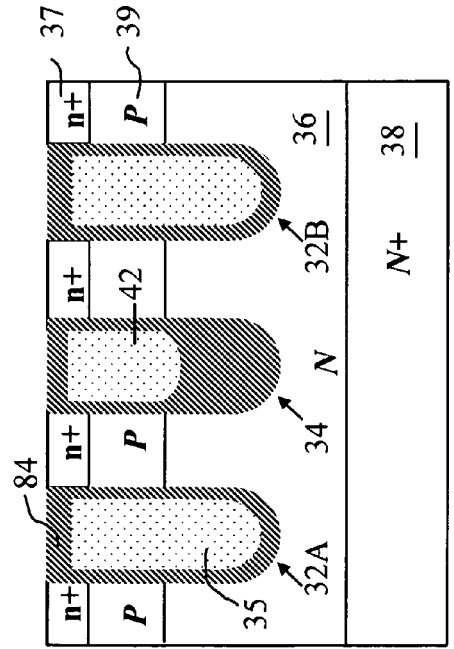

The polysilicon layer 82 is etched back and an oxide layer is deposited and later etched, leaving the RFP electrodes 35 and the gate electrode 42 covered by an oxide layer 84, as shown in FIG. 6G

The source contact layer 46 is deposited and defined by a photoresist mask (not shown). The back side of the n+ substrate 38 is thinned and the drain metal layer 31 deposited, resulting in the MOSFET 30 shown in FIGS. 3A and 6H.

Figures 7A, 7B:
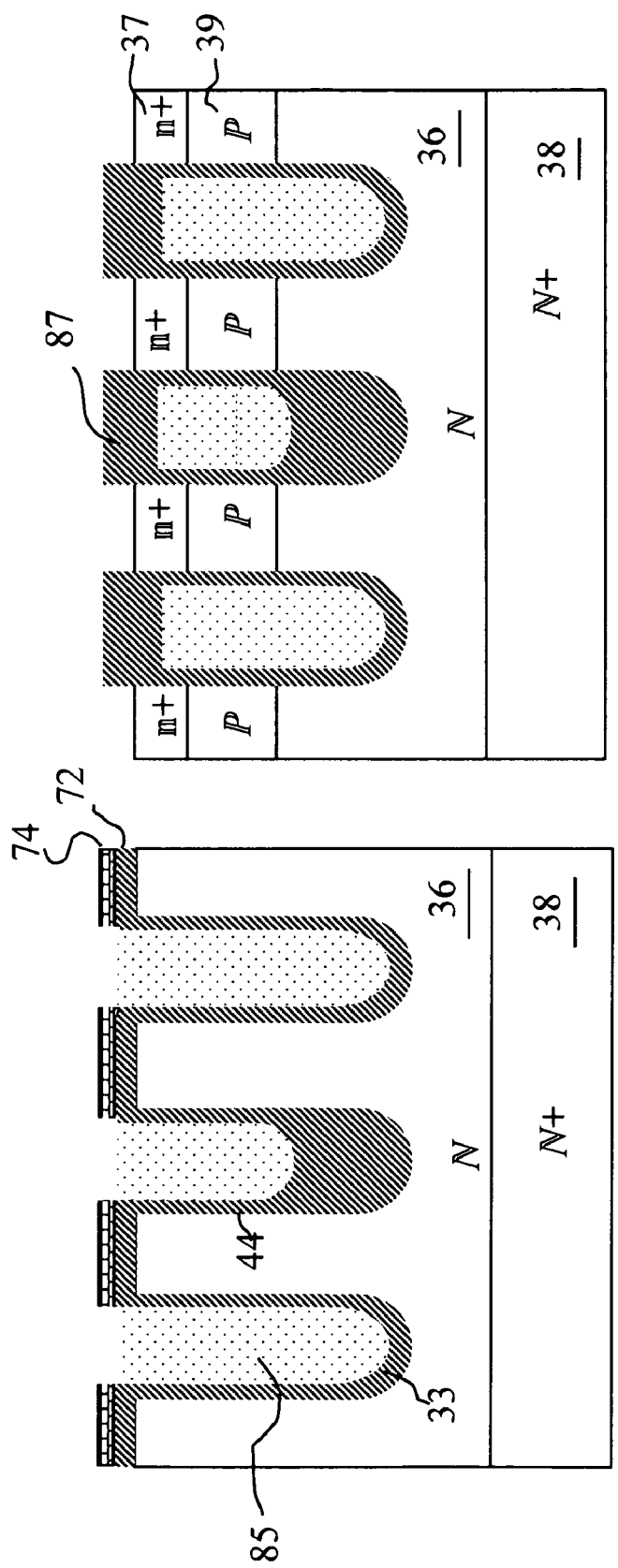
FIGS. 7A and B illustrate an alternative version of a portion of the process shown in FIGS. 6A-6H.

In an alternative method, after the step shown in FIG. 6D the portions of oxide layer 78 remaining in RFP trenches 32A and 32B and in gate trench 34 are etched, and the steps shown in FIGS. 7A and 7B are performed. As shown in FIG. 7A, with oxide layer 72 and nitride layer 74 still in place oxide layers 33 and 44 are thermally grown on the walls of the RFP and gate trenches 32A/32B and 34, respectively. A polysilicon layer 85 is deposited and partially removed by etching or CMP so that the surface of the polysilicon layer 85 is level with or below the surface of the nitride layer 74. The resulting structure is shown in FIG. 7A.

The polysilicon layer 85 is etched (e.g., by about 0.1 μm) and an oxide layer 87 is deposited and etched back so that the surface of oxide layer 87 is level with or below the nitride layer 74. Nitride layer 74 is removed by etching and optionally oxide layer 72 may be removed and a sacrificial oxide layer (not shown) may be re-grown. P-body regions 39 and n+ source regions 37 are implanted. Oxide layer 87 is then removed from the areas over the n+ source regions 37, leaving the structure shown in FIG. 7B. A source contact layer (not shown) is then deposited on top of the oxide layer 87 and n+ source regions 37.

Figure 8A:
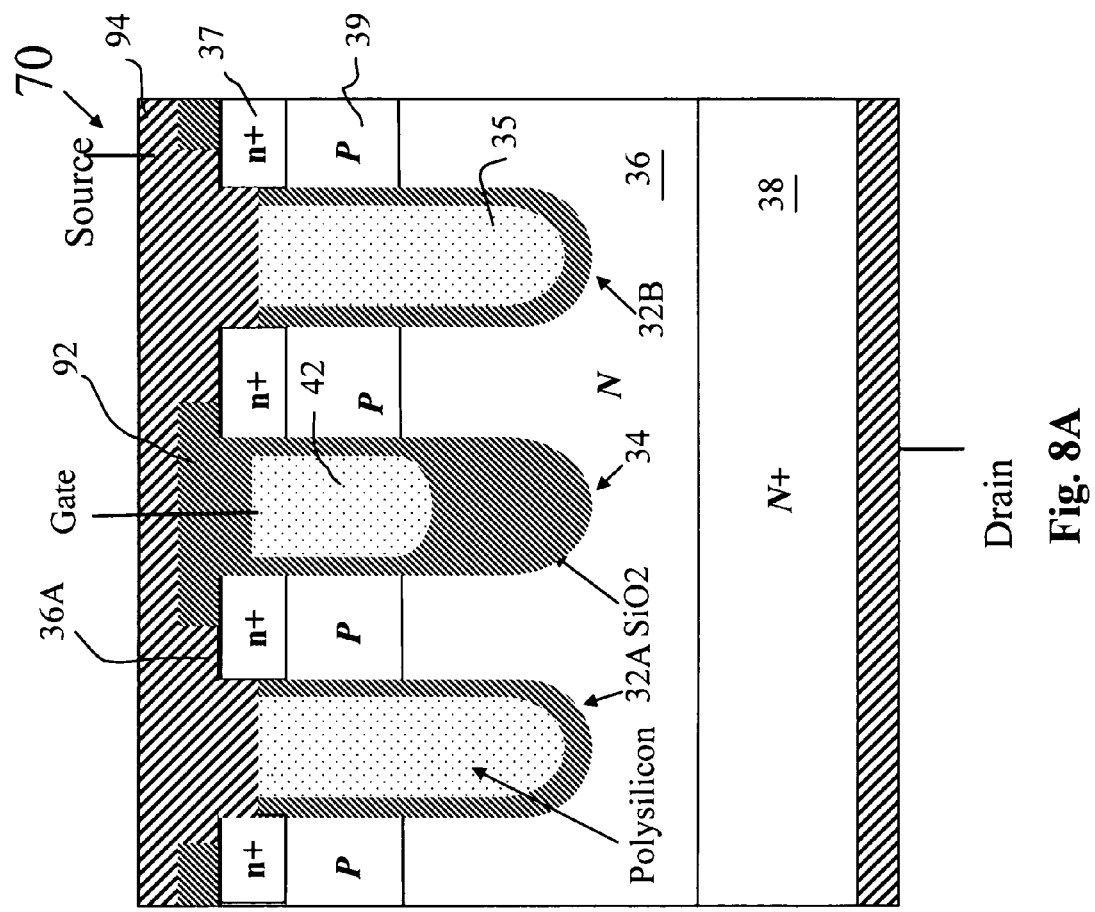
FIGS. 8A and 8B are cross-sectional views of a MOSFET according to the invention wherein an insulating layer above the gate trench overlaps a portion of the source regions and the source contact layer contacts the RFP electrodes.
Figure 8B:
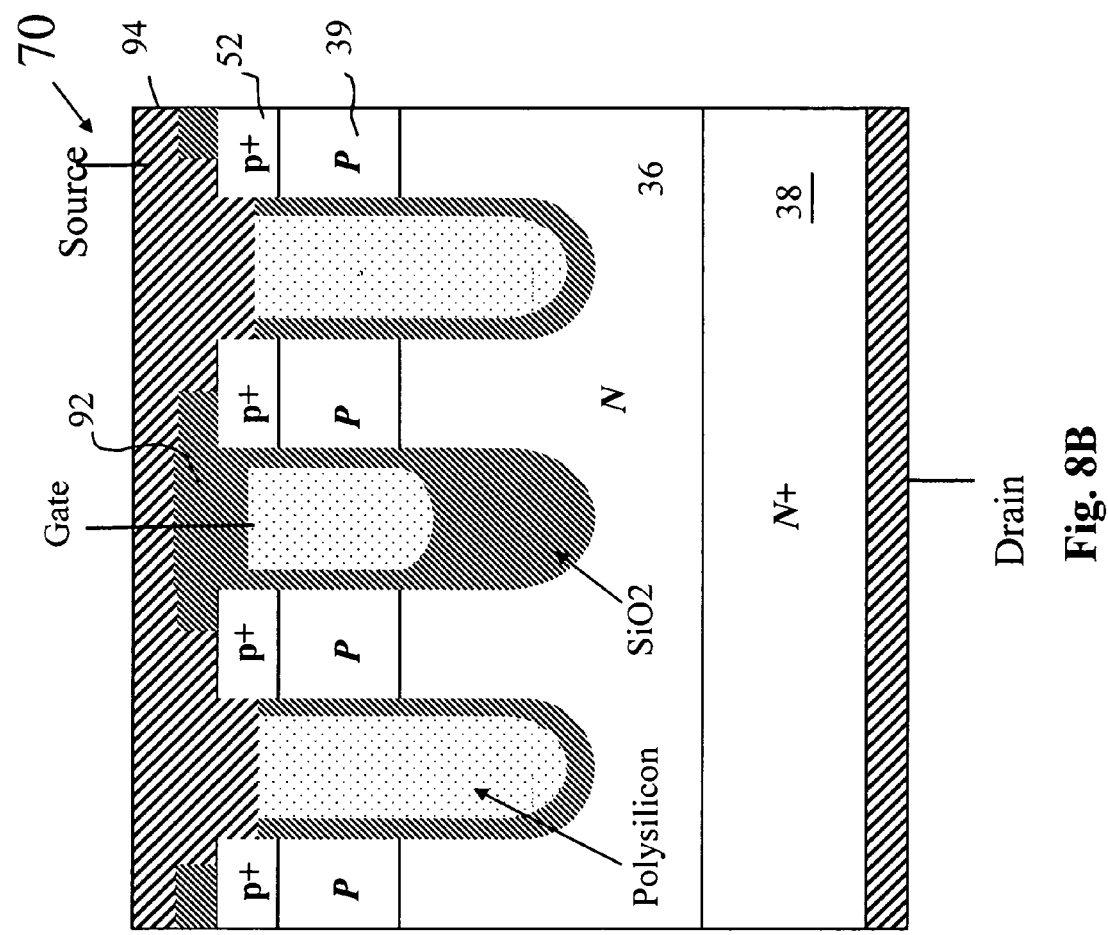

Numerous variations of the MOSFETs described above are within the scope of this invention. In a MOSFET 70 shown in FIG. 8A, an insulating layer 92 over the gate electrode 42 extends above the surface 36A of epitaxial layer 36 and partially covers the n+ source regions 37, while the RFP electrodes 35 remain recessed below the surface 36A. A source contact layer 94 contacts the RFP electrodes 35 so that the RFP electrodes 35 are biased at the source potential. FIG. 8B is another view of MOSFET 70, taken at a cross-section similar to cross-section 4B-4B shown in FIG. 4A, where the n+ source regions are replaced by p+ body contact regions 52.

Figure 9:
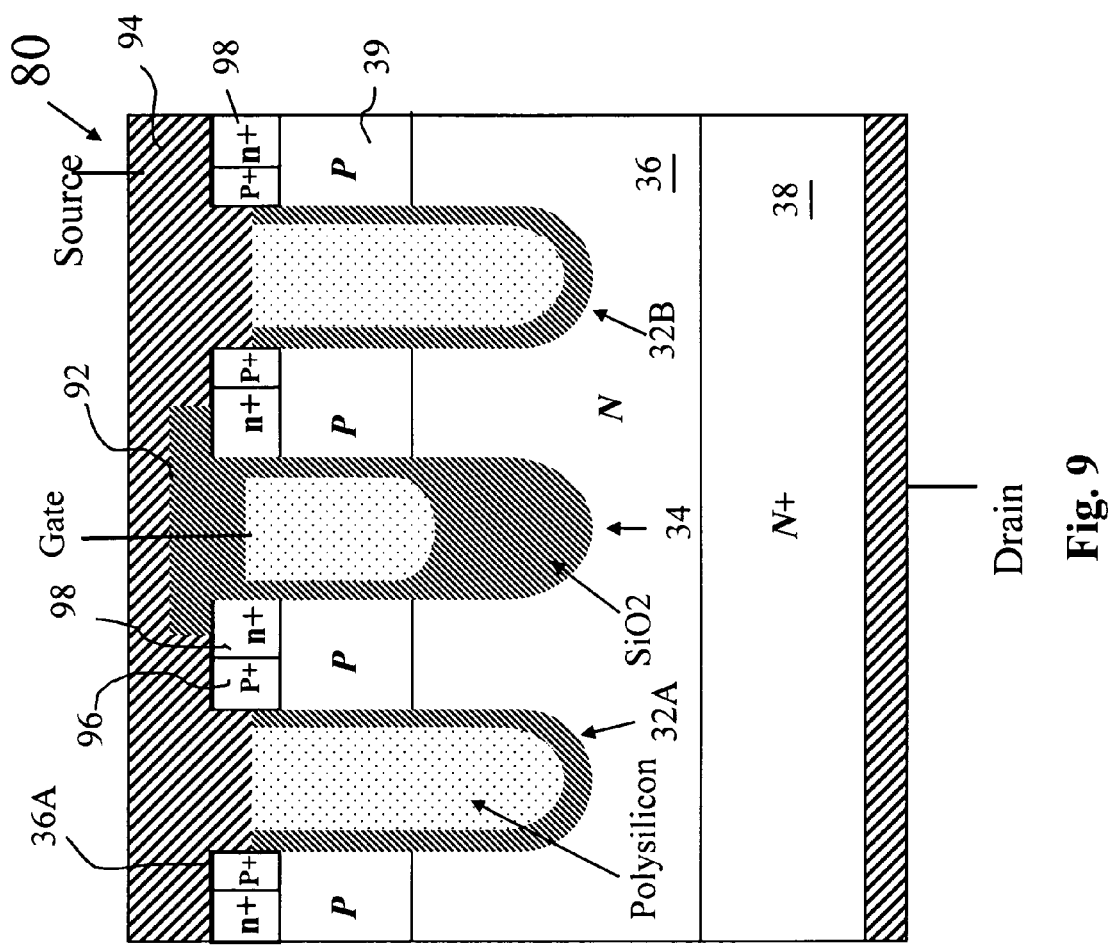
FIG. 9 is a cross-sectional view of a MOSFET similar to the MOSFET of FIGS. 8A and 8B wherein body contact regions are formed laterally adjacent to the source regions.
Figure 10:
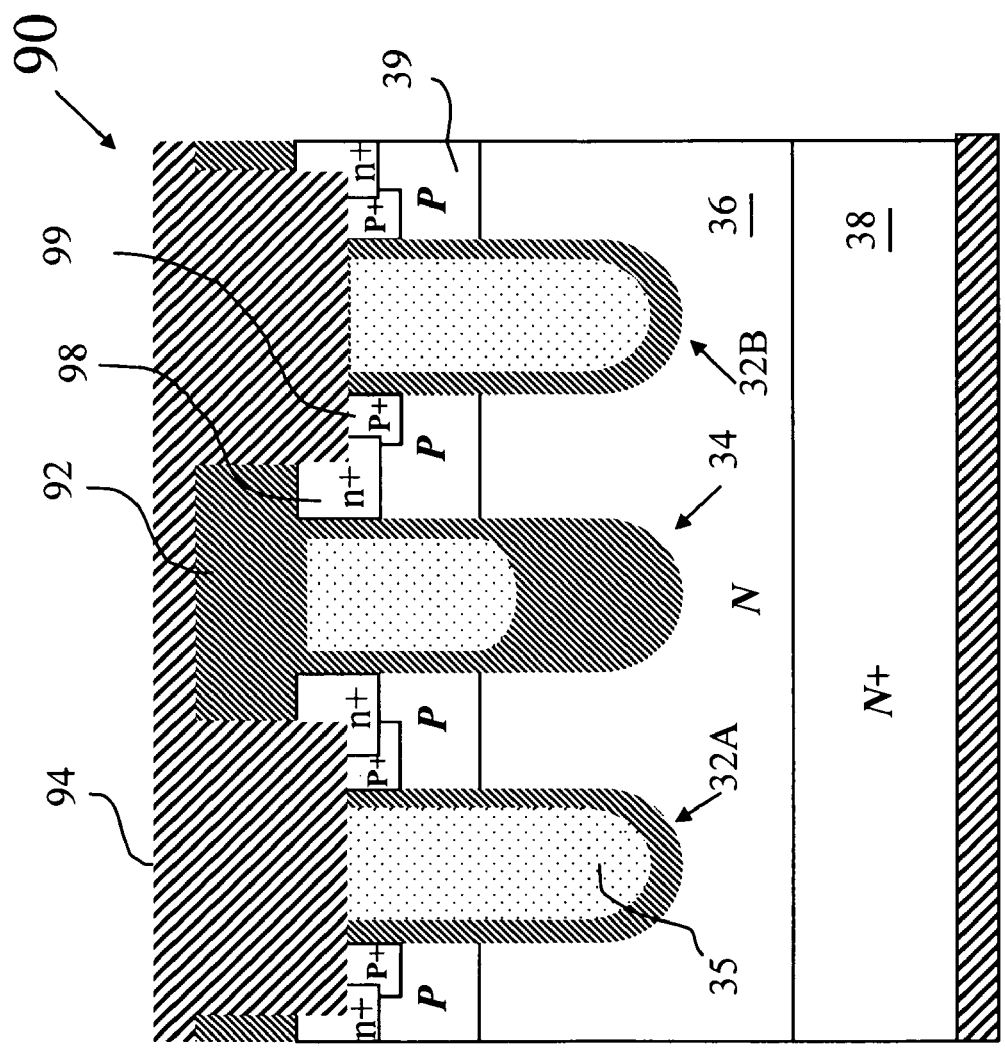
FIG. 10 is a cross-sectional view of an MOSFET similar to the MOSFET of FIG. 9 wherein the body contact regions extend to a level below the source regions.

A MOSFET 80, shown in FIG. 9, is similar to MOSFET 70 except that p+ body contact regions 96 are formed adjacent to n+ source regions 98 at the surface 36A of epitaxial layer 36 to provide a source-body short via source contact layer 94. In MOSFET 80, it would not be necessary to interrupt the n+ source regions with p+ body contact regions 52 as shown in FIG. 4A to provide a source-body short. MOSFET 90, shown in FIG. 10, is similar to MOSFET 80 except that p+ body contact regions 99 extend to a level below the bottoms of n+ source regions to provide a larger surface along the walls of RFP trenches 32A and 32B for contact with source contact layer 94. A process for making MOSFET 90 is shown in FIGS. 14A-14H.

Figure 11:
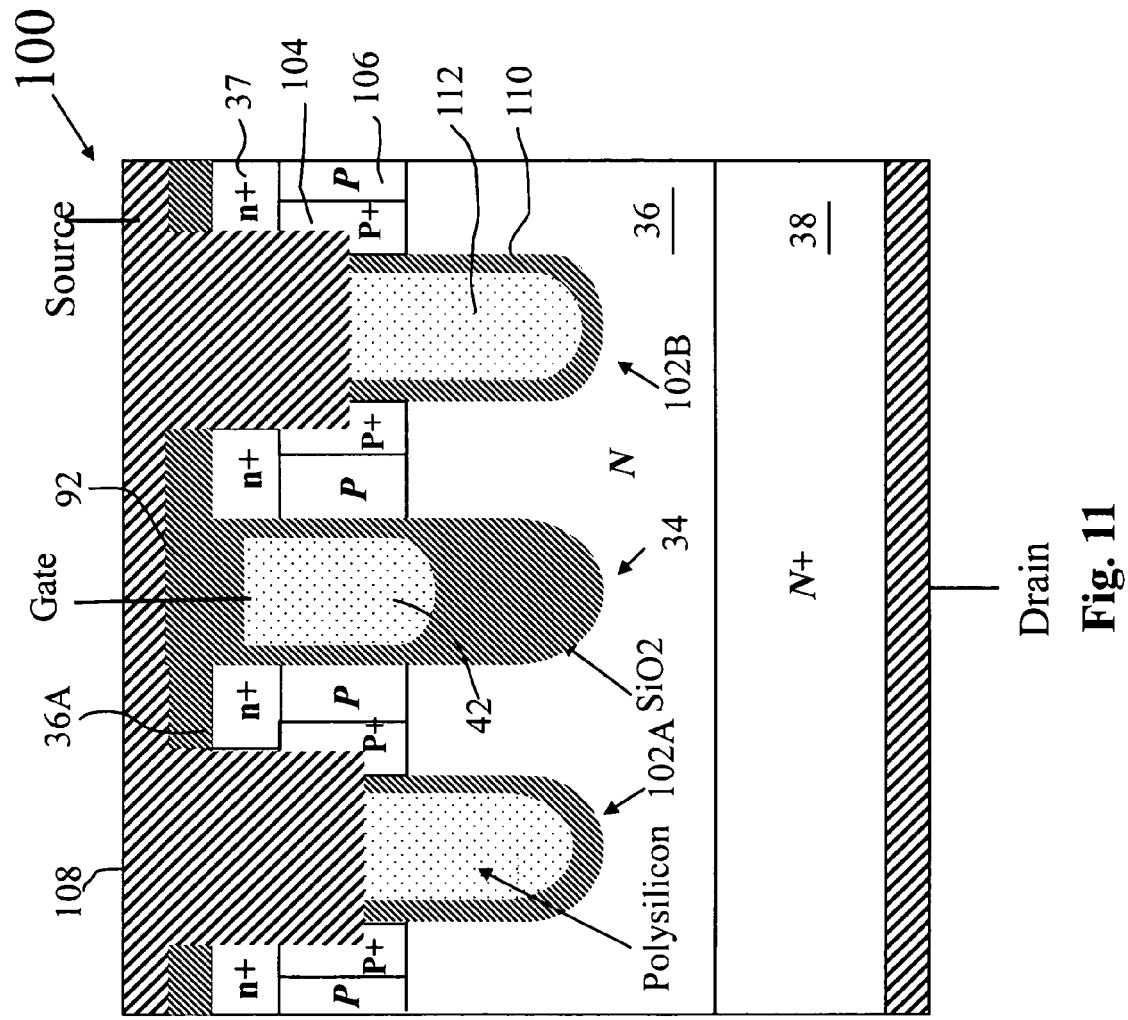
FIG. 11 is a cross-sectional view of a MOSFET according to the invention wherein the RFP electrodes are recessed and body contact regions are formed laterally adjacent to the body regions.
Figure 12:
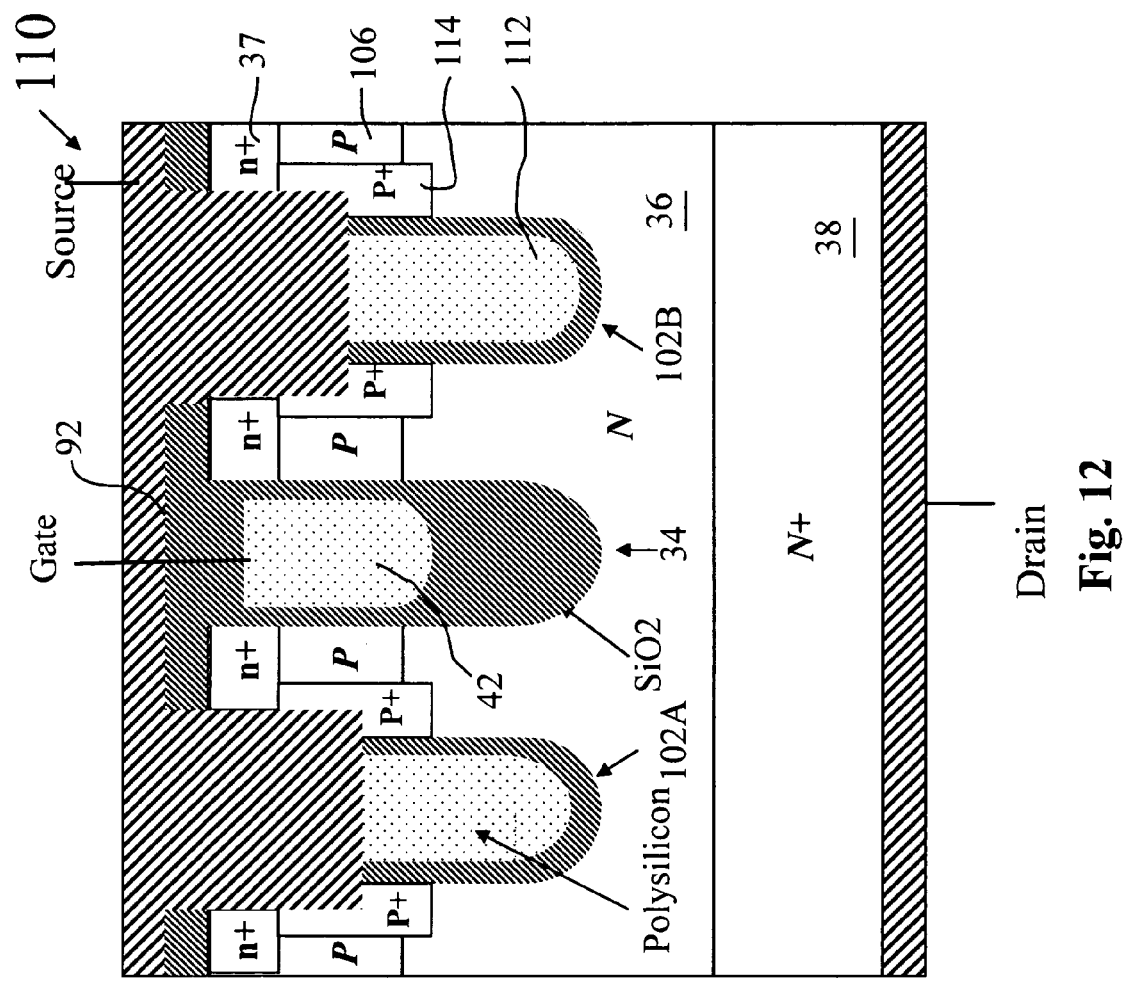
FIG. 12 is a cross-sectional view of a MOSFET similar to the MOSFET of FIG. 11 wherein the body contact regions extend to a level below the body regions.
Figure 13:
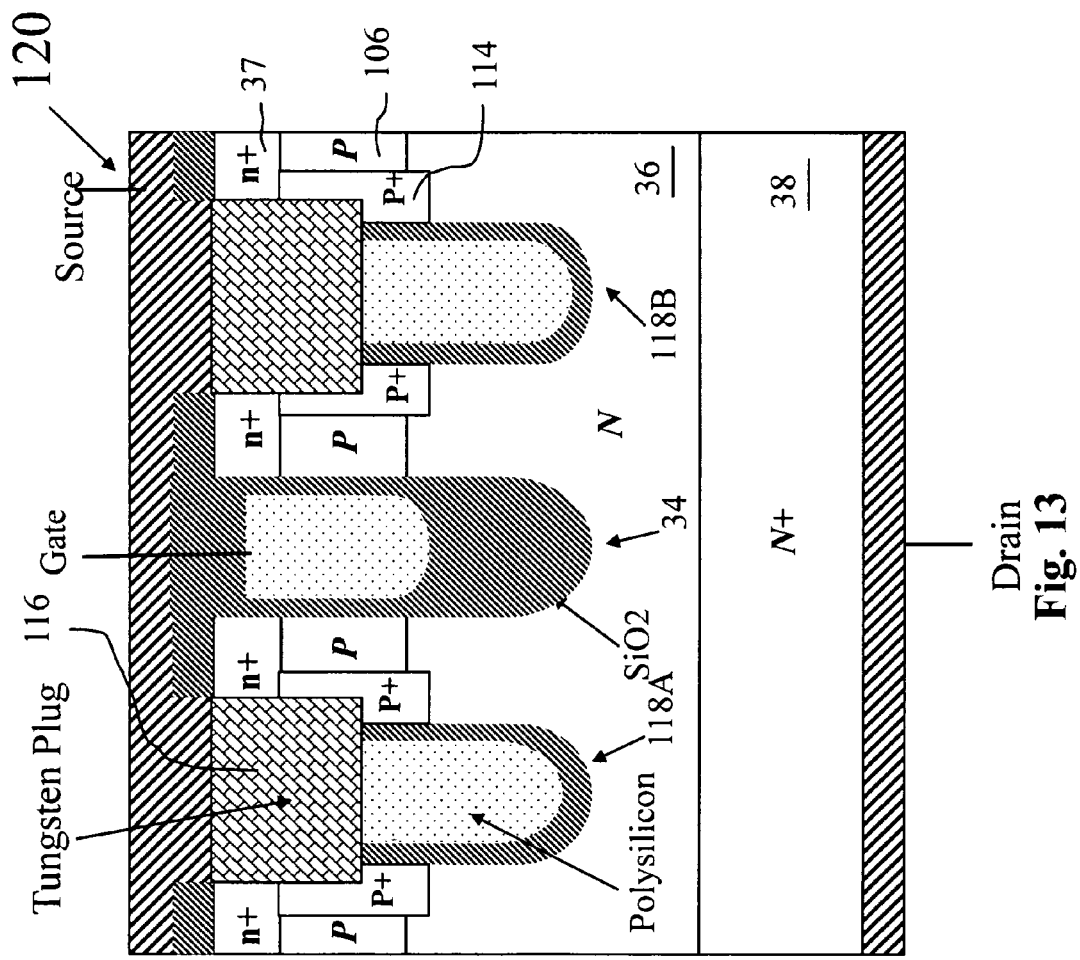
FIG. 13 is a cross-sectional view of a MOSFET similar to the MOSFET of FIG. 12 wherein metal plugs are formed in the upper portions of the RFP trenches.

In MOSFET 100, shown in FIG. 11, p+ body contact regions 104 are formed below the n+ source regions 37 and adjacent to the p-body regions 106. The bottom junctions of p-body regions 106 and p+ body contact regions 104 are at approximately the same level in epitaxial layer 36. In RFP trenches 102A and 102B, the RFP electrodes 112 and the oxide layers 110 are recessed sufficiently to permit the source contact layer 108 to contact the p+ body contact regions 104, thereby providing a source-body short. In the gate trench 34, insulating layer 92 extends above the surface 36A of epitaxial layer 36 and covers the n+ source regions 37. MOSFET 100 may allow for a higher cell density and therefore a lower specific on-resistance. MOSFET 110, shown in FIG. 12, is similar to MOSFET 100 except that p+ body contact regions 114 extend to a level below the bottom of p-body regions 106. MOSFET 120, shown in FIG. 13, is similar to MOSFET 110 except that RFP trenches 118A and 118B contain metal plugs 116, comprising for example tungsten, which contact both the source regions 37 and the p+ body contact regions 114 to provide a very low-resistance conduction path between source regions 37 and p+ body contact regions 114.

Figure 14A:
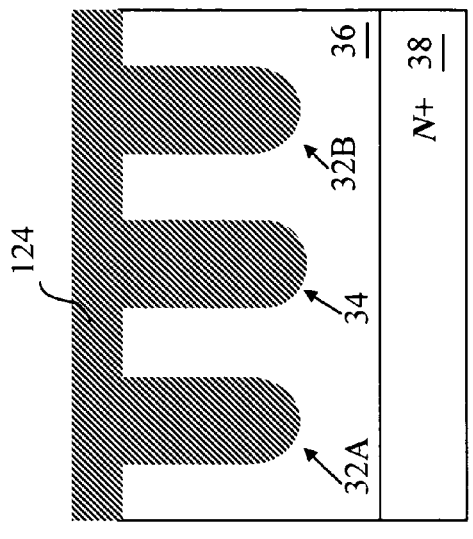
FIGS. 14A-14H illustrate a process of fabricating the MOSFET shown in FIG. 10.

FIGS. 14A-14H illustrate a process of fabricating MOSFET 90, shown in FIG. 10. The process starts with growing n-type epitaxial layer 36 on top of n+ substrate 38. As shown in FIG. 14A, an oxide layer 120 (e.g., 0.5 μm thick) and a photoresist trench mask layer 122 are deposited over the top surface of epitaxial layer 36. Mask layer 122 is patterned to form openings and oxide layer 120 and epitaxial layer 36 are etched through the openings to form RFP trenches 32A and 32B and gate trench 34. The mask layer 122 and oxide layer 120 are removed, and a sacrificial oxide layer and a pad oxide layer (not shown) are grown.

Figure 14B:
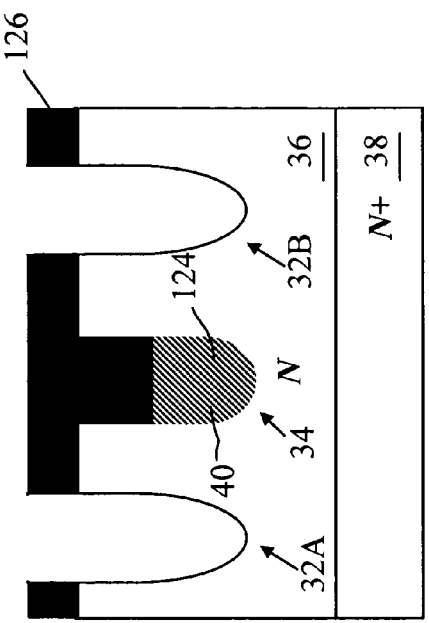
Figure 14C:
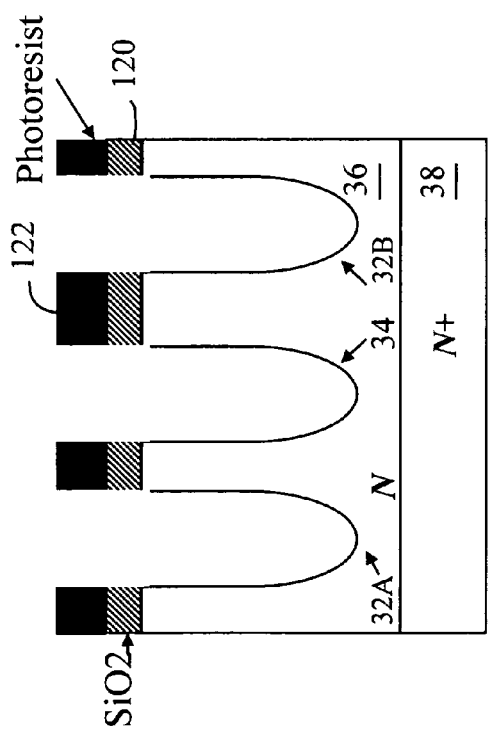

As shown in FIG. 14B, an oxide layer 124 is deposited in trenches 32A, 32B and 34. Oxide layer 124 is preferably a high quality oxide, such as a high-density plasma oxide. An active mask (not shown) is deposited and patterned with an opening over the active areas of the die, and oxide layer 124 is etched down into trenches 32A, 32B and 34, as shown in FIG. 14C. The active mask prevents optional field termination oxide (not shown) or oxide layer 124 from being etched in the termination areas of the die.

Figure 14D:
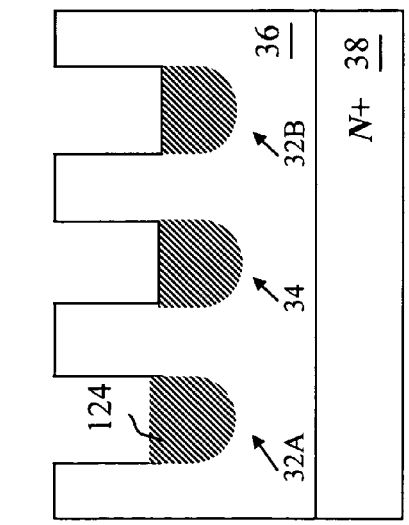

A photoresist bottom oxide (BOX) mask layer 126 is deposited and patterned with openings over the RFP trenches 32A and 32B, and the remains of oxide layer 124 is removed from RFP trenches 32A and 32B, leaving the remains of oxide layer 124 (which becomes insulating layer 40) in the bottom of gate trench 34. The resulting structure is shown in FIG. 14D.

Figure 14F:
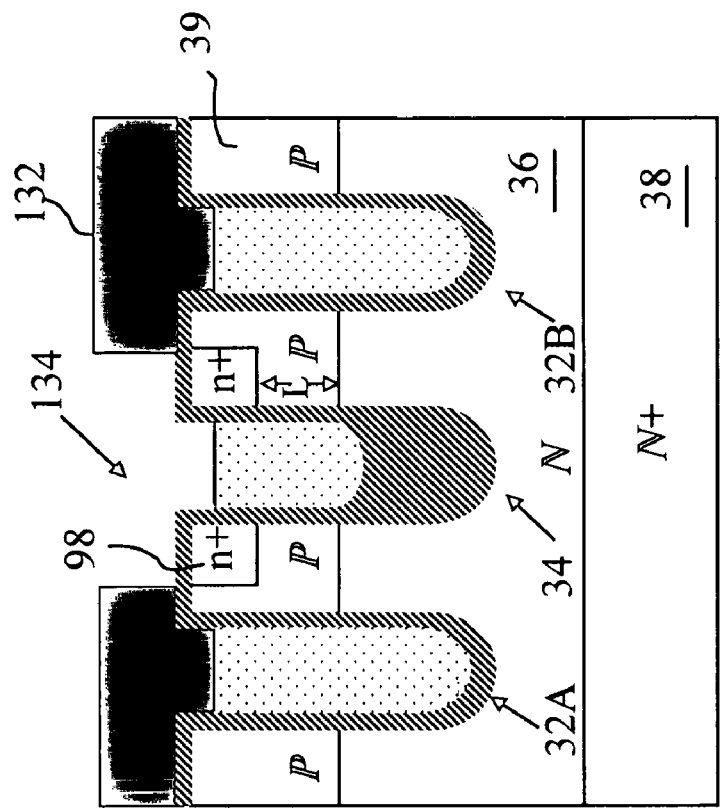
Figure 14E:
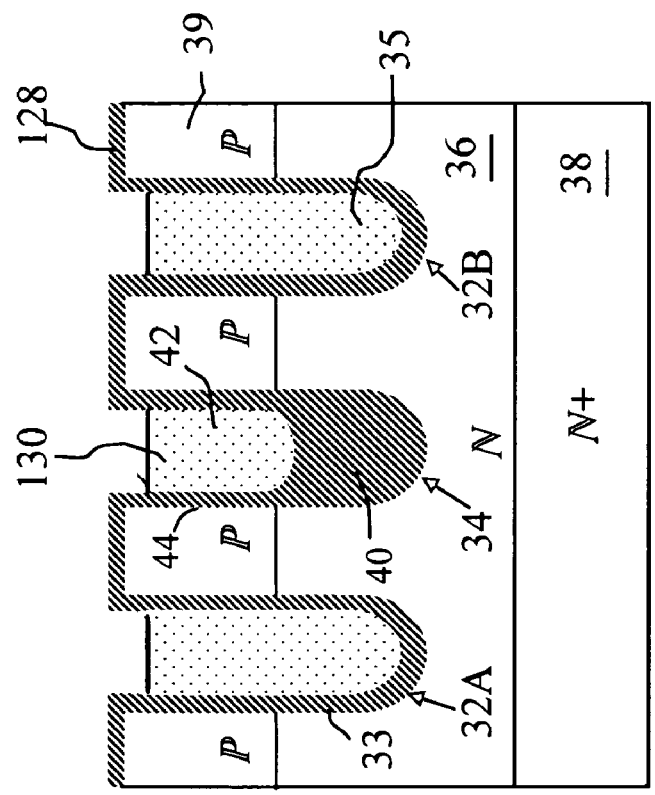

BOX mask layer 126 is removed and, as shown in FIG. 14E, an oxide layer 128 is grown, resulting in the formation of oxide layer 33 on the walls of RFP trenches 32A and 32B and oxide layer 44 on the walls of gate trench 34 above insulating layer 40. A polysilicon layer 130 is deposited (e.g., 7000 Å thick) and a mask layer (not shown) is deposited and patterned, and polysilicon layer 130 is etched back into trenches 32A, 32B and 34 using CMP and/or a dry etch process, thereby forming the gate electrode 42 in gate trench 34 and the RFP electrodes 35 in RFP trenches 32A and 32B. A p-type dopant is implanted to form p-body regions 39 (e.g., boron at a dose of $5\times10^{12}$ cm$^{-2}$ and an energy of 100 keV). A rapid thermal anneal (RTA) process may be performed at a temperature of 1025° C. for 30 seconds, for example, resulting in a junction depth of 0.5 μm for p-body regions 39.

As shown in FIG. 14F, a photoresist source mask layer 132 is deposited and patterned to form an opening, and an n-type dopant is implanted to form n+ source regions 98 at the surface of epitaxial layer 36 adjacent to gate trench 34. For example, arsenic may be implanted at a dose of $2\times10^{15}$ cm$^{-2}$ and an energy of 80 keV to provide a junction depth of 0.2 μm for n+ source regions 98 and a channel length (L) of 0.25-0.3 μm.

Figure 14H:
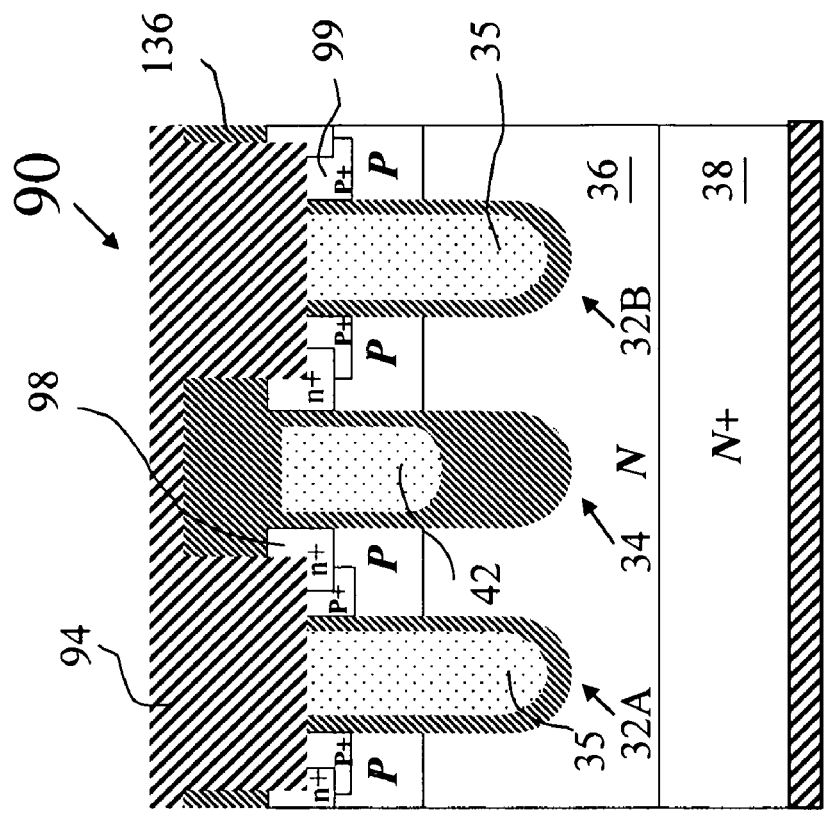
Figure 14G:
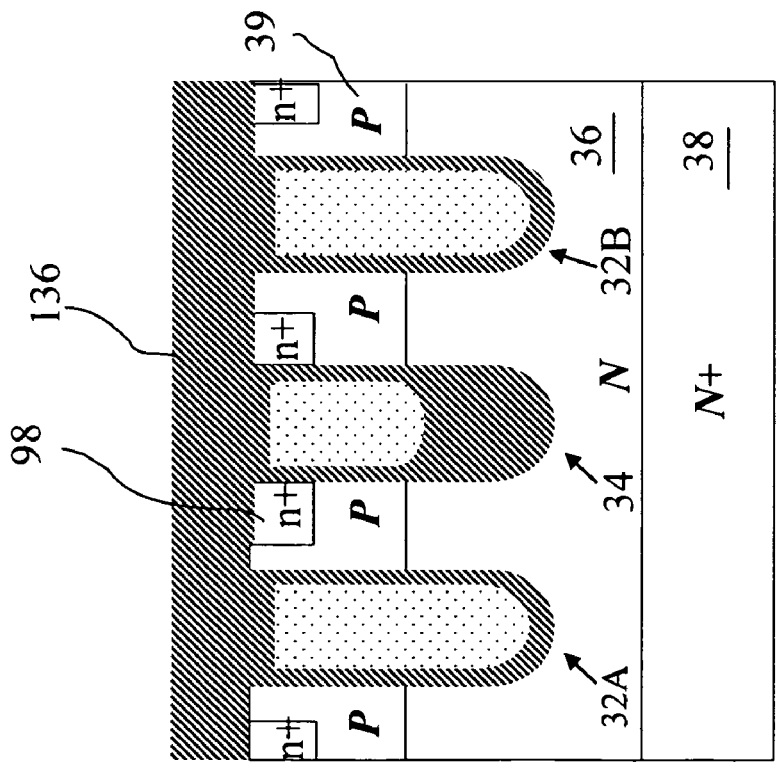

Source mask layer 132 is removed and, as shown in FIG. 14G, an inter-level dielectric (ILD) layer 136—e.g., low-temperature oxide (LTO) and borophosphosilicate glass (BPSG)—is deposited to a thickness of 0.5-1.5 μm, for example. ILD layer 136 may then be densified.

As shown in FIG. 14H, a contact mask layer (not shown) is deposited on ILD layer 136 and patterned with openings over RFP trenches 32A and 32B, and ILD layer 136 and portions of RFP electrodes 35 are dry or wet etched through the openings in the contact mask layer. A reflow process may be performed on ILD layer 136. A p-type dopant is implanted to form p+ body contact regions 99. For example, boron may be implanted at a dose of $1\times10^{15}$ cm$^{-2}$ to $4\times10^{15}$ cm$^{-2}$ and an energy of 20-60 keV to produce a junction depth of 0.4 μm for p+ body contact regions 99. Source contact layer 94 is then deposited in contact with the RFP electrodes 35, resulting in MOSFET 90. Optionally, tungsten plugs may be formed in the upper portions of RFP trenches 32A and 32B in contact with RFP electrodes 35 before source contact layer 94 is deposited.

In a variation of the process, as shown in FIG. 15A, the polysilicon layer 130 is etched further down into RFP trenches 32A and 32B through the openings in the contact mask layer, forming RFP electrodes 112. A p-type dopant such as boron is then implanted at an angle, forming p+ body contact regions 114 that are located below n+ source regions 37 and may extend further into the epitaxial layer 36 than the bottoms of p-body regions 106. As shown in FIG. 15B, metal plugs 116, comprising tungsten, for example, may be formed in the upper portions of RFP trenches 32A and 32B before source contact layer 94 is deposited. Except for the presence of the metal plugs 116, MOSFET 130 is similar to MOSFET 110, shown in FIG. 12.

Figure 16A:
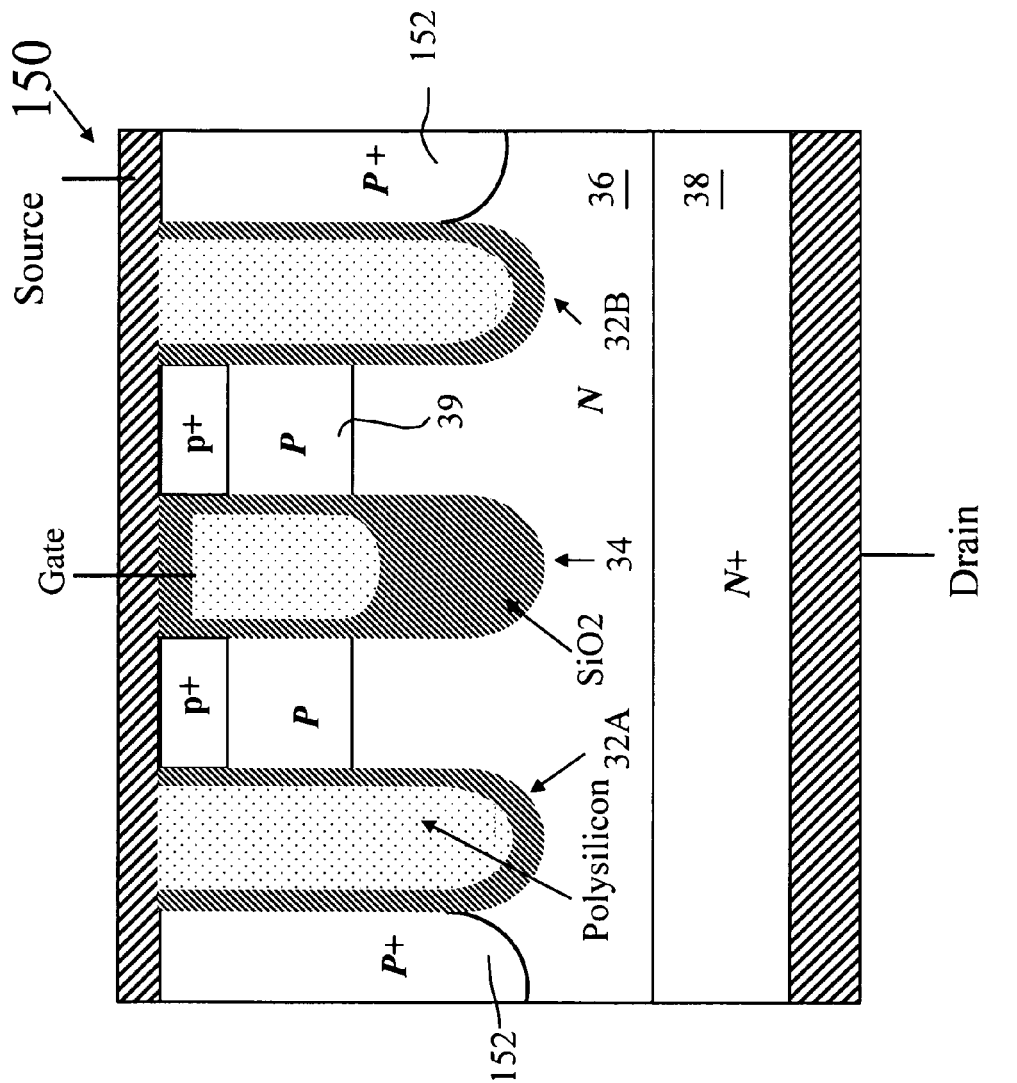
FIGS. 16A and 16B are cross-sectional views of MOSFETs according to the invention that contain deep p-type regions to limit the breakdown voltage of the MOSFET.
Figure 16B:
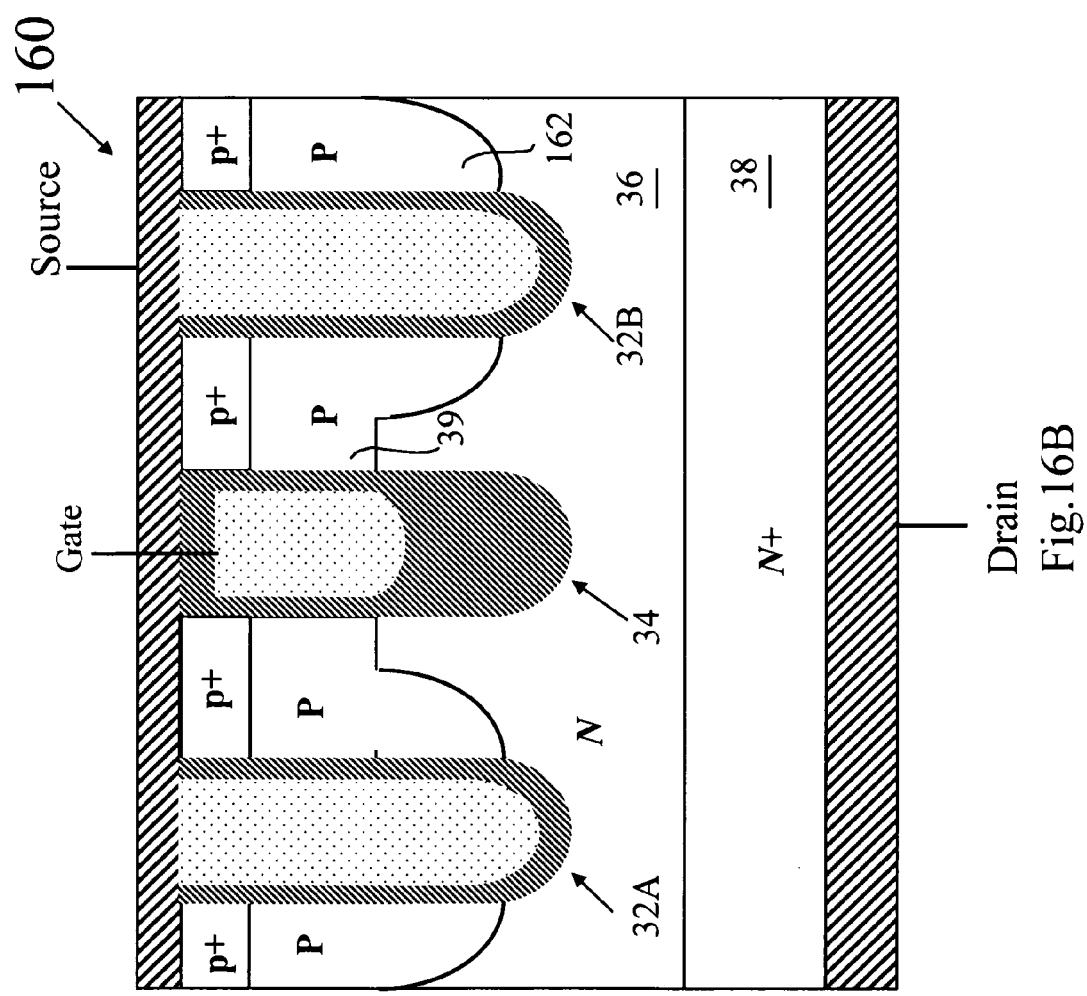

Numerous other embodiments are possible within the broad scope of this invention. In some embodiments, a deeper p region is formed in selected areas of the MOSFET to clamp its breakdown voltage to a predetermined value that is lower than the breakdown voltage of the RFP trench or other points in the device. In MOSFET 150, shown in FIG. 16A, deep p+ regions 152 are located outside of the areas between the RFP trenches 32A and 32B and the gate trench 34. In MOSFET 160, shown in FIG. 16B, deep p+ regions 162 are located on both sides of each of the RFP trenches 32A and 32B. P+ regions 152 and 162 extend deeper into the epitaxial layer 36 than the p-body regions 39 and may be as deep as the RFP trenches 32A and 32B and the gate trench 34. It should be noted that FIGS. 16A and 16B are taken at cross-sections where there is no n+ source region.

Figure 17:
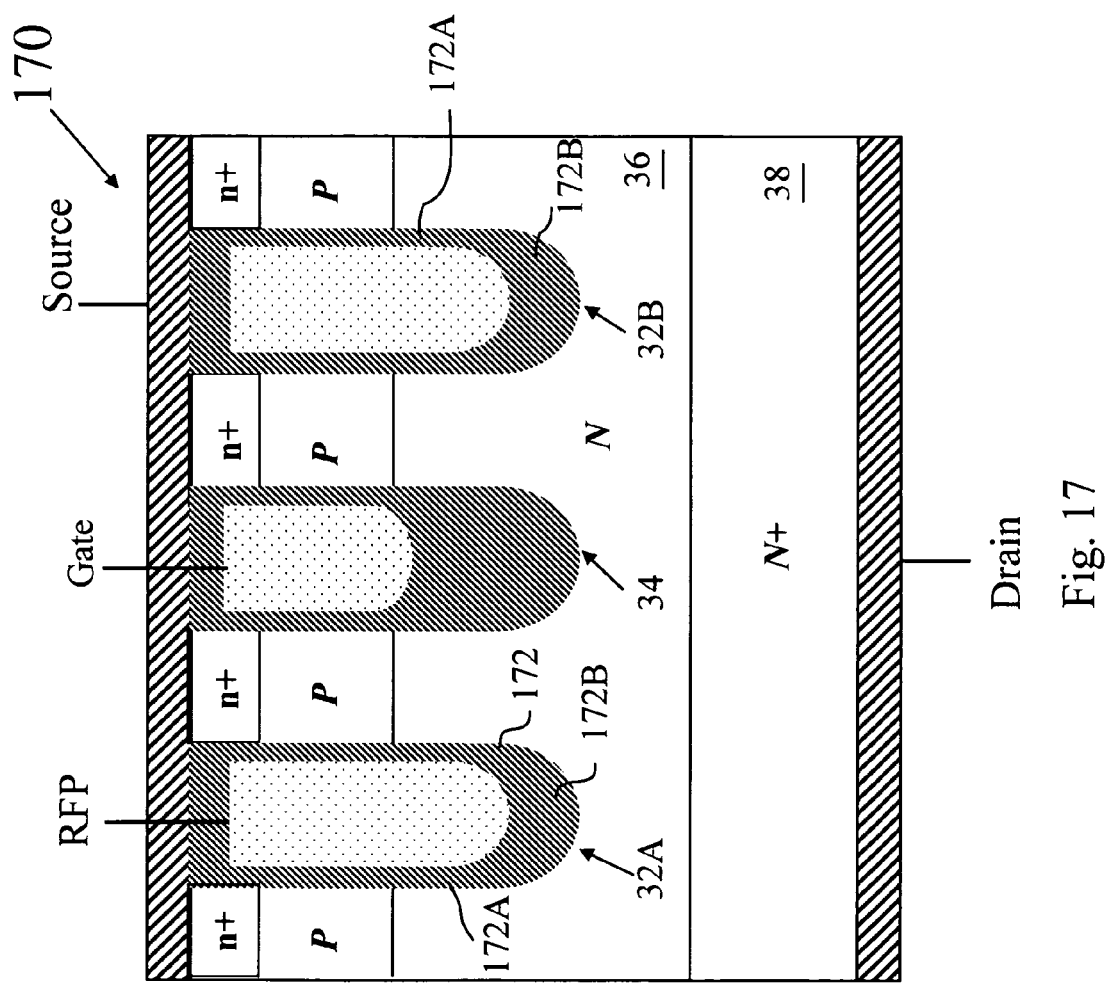
FIG. 17 is a cross-sectional view of a MOSFETs according to the invention wherein the RFP trenches contain a thick bottom oxide layer.

In another embodiment, the insulating layers lining the RFP trenches are thicker at the bottoms of the trenches than on the sides of the trenches. In MOSFET 170, shown in FIG. 17, the insulating layer 172 lining the walls of RFP trenches 32A and 32B includes a section 172B at the bottom of the trench that is thicker than a section 172A along the sidewalls of the trench.

In other embodiments, the doping of the N-epitaxial drain-drift region 41 of the epitaxial layer 36 is non-uniform (see FIG. 3A). For example, the doping of drain-drift region 41 may be non-uniform, with the doping concentration increasing with increasing depth in the epitaxial layer 36 so that the doping concentration in the areas 41A of drain-drift region 41 is less than the doping concentration in the portion of drain-drift region 41 below areas 41A.

Figure 18A:
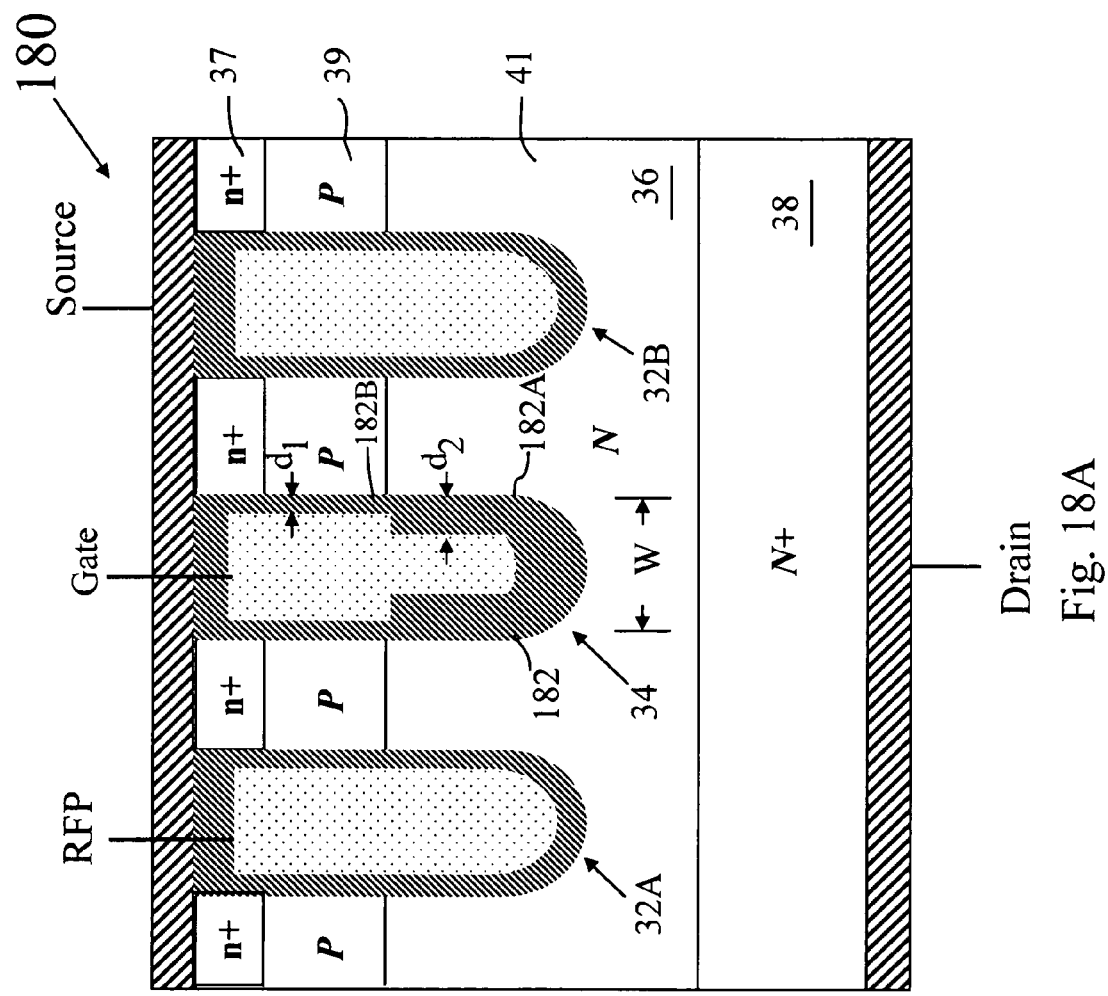
FIGS. 18A-18C are cross-sectional views of MOSFETs containing a stepped oxide layer in the gate trench and/or the RFP trenches.

Other variations of the new structure include a stepped oxide lining the gate trench and/or the RFP trench. In MOSFET 180, shown in FIG. 18A, the gate oxide layer 182 in gate trench 34 includes a thinner section 182B, having a thickness $d_1$, on the sidewalls of the trench 34 adjacent to the p-body regions 39 and a thicker section 182A, having a thickness $d_2$, along the lower sidewalls and bottom of the trench 34. The thickness $d_2$ is less than one-half the width W of the trench 34, so that the gate oxide layer 182 forms a "keyhole" shape. In MOSFET 180 the thinner section 182B and the thicker section 182A are joined at a location adjacent to the junction between the p-body regions 39 and the drain-drift region 41.

Figure 18B:
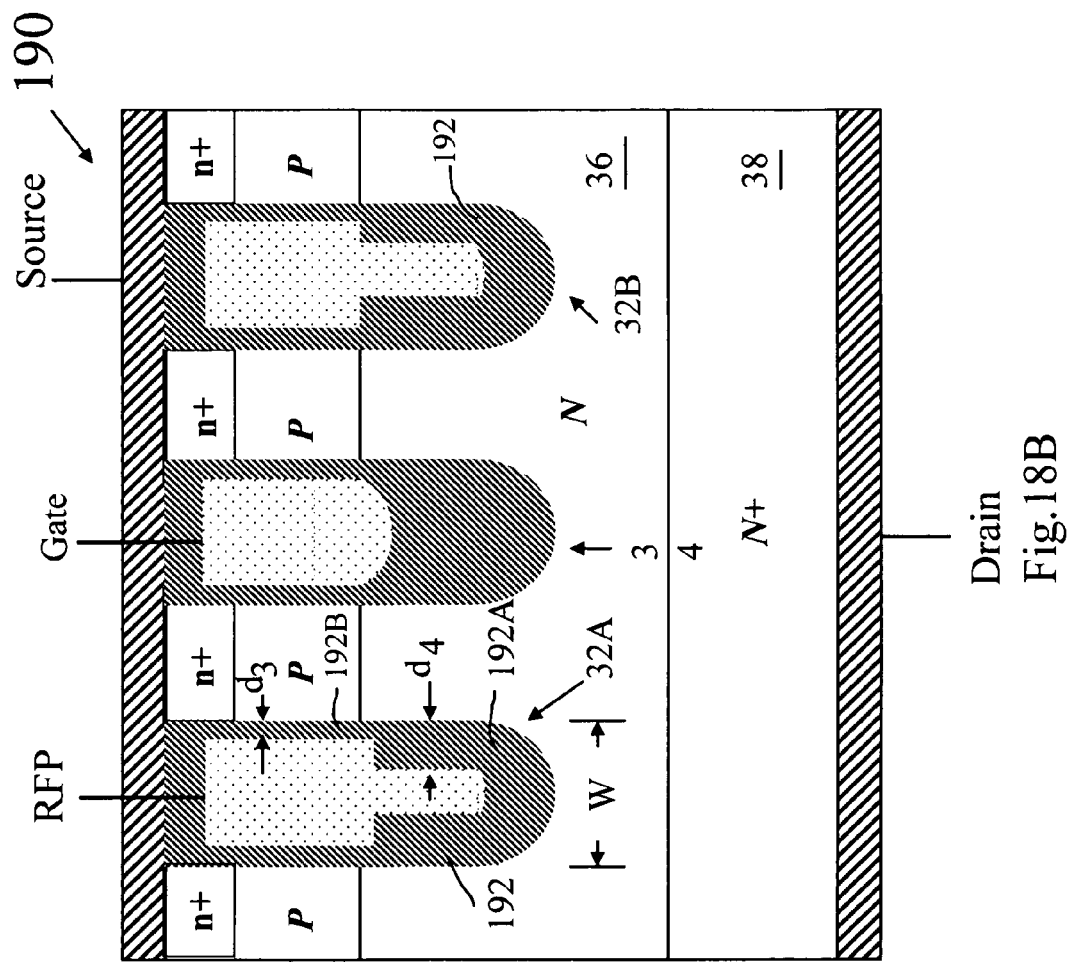

Similarly, in MOSFET 190, shown in FIG. 18B, the oxide layer 192 in each of the RFP trenches 32A and 32B includes a thinner section 192B, having a thickness $d_3$, on the upper sidewalls of the trenches 32A and 32B and a thicker section 192A, having a thickness $d_4$, along the lower sidewalls and bottom of the trenches 32A and 32B. The thickness $d_4$ is less than one-half the width W of the trenches 32A and 32B, so that the oxide layer 192 forms a "keyhole" shape.

Figure 18C:
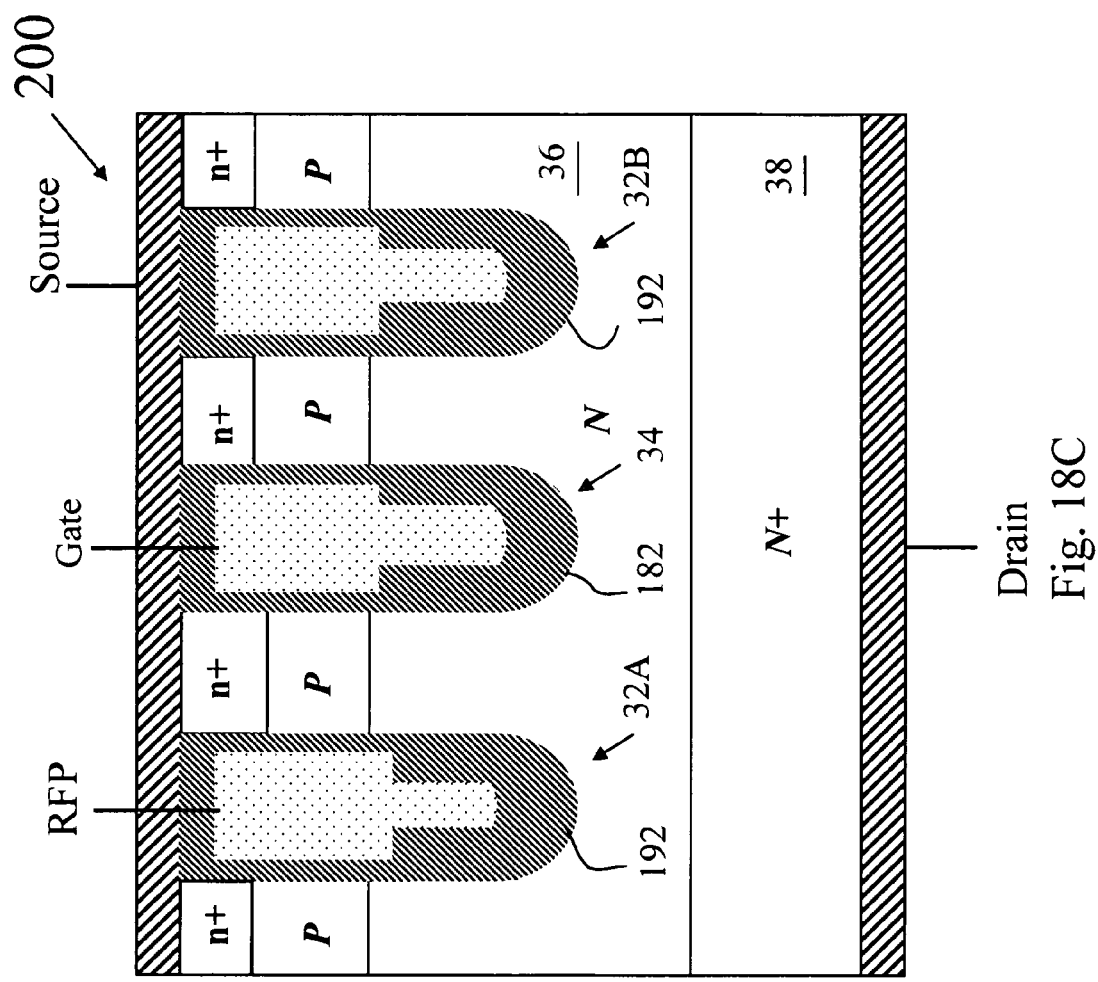

In MOSFET 200, shown in FIG. 18C, the gate trench 34 contains the gate oxide layer 182 (as described above) and the RFP trenches 32A and 32B contain the oxide layer 192 (as described above).

Figure 19:
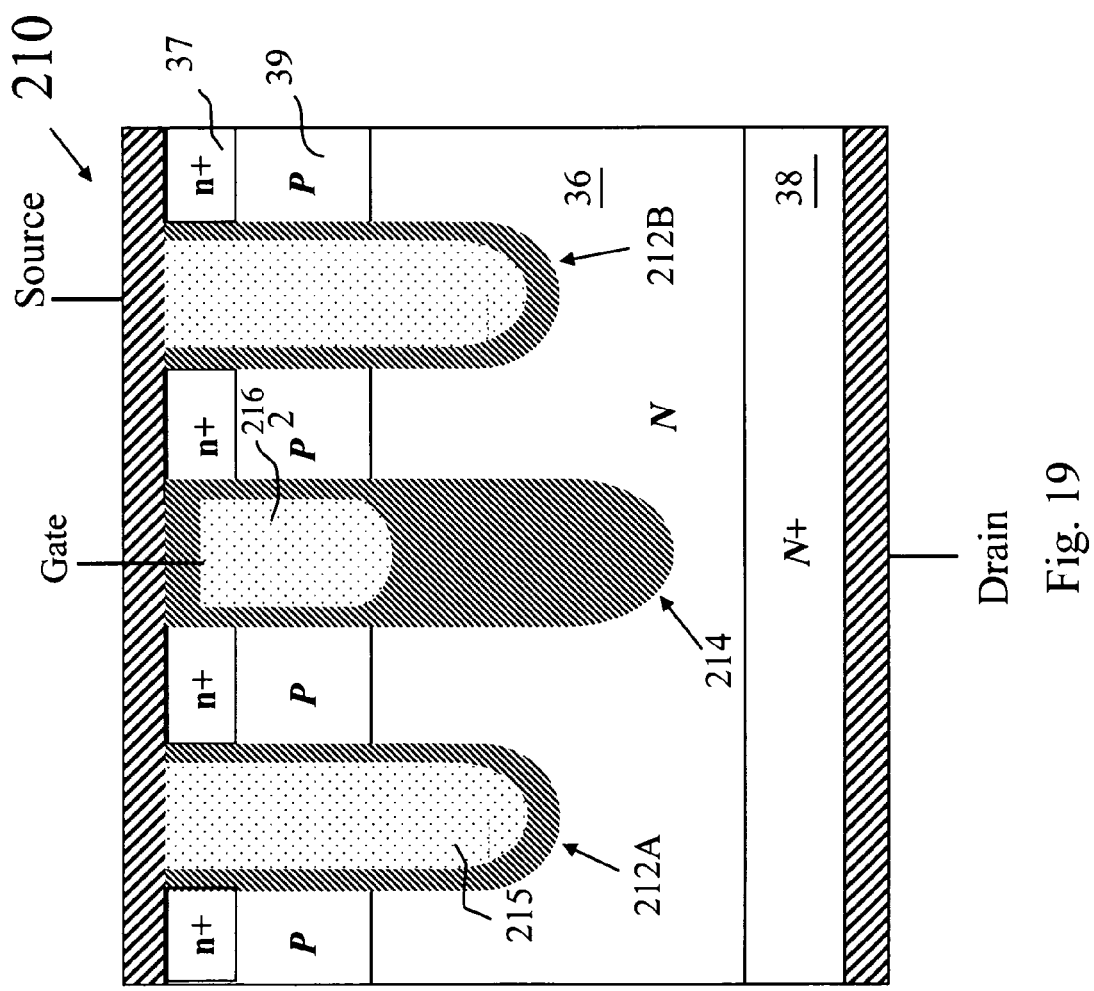
FIG. 19 is a cross-sectional view of a MOSFET wherein the gate trench is deeper than the RFP trenches.

In MOSFET 210, shown in FIG. 19, the gate trench 214 is deeper than the RFP trenches 212A and 212B to reduce the electric field at the RFP trenches 212A and 212B, while the gate electrode 216 is shallower than the RFP electrodes 215. For example, gate trench 214 extends to a deeper level in epitaxial layer 36 than the bottoms of RFP trenches 212A and 212B but owing to the thickness of insulating layer 40 at the bottom of the gate trench 216 RFP electrodes 215 extend to a deeper level than gate electrode 216.

Figure 20:
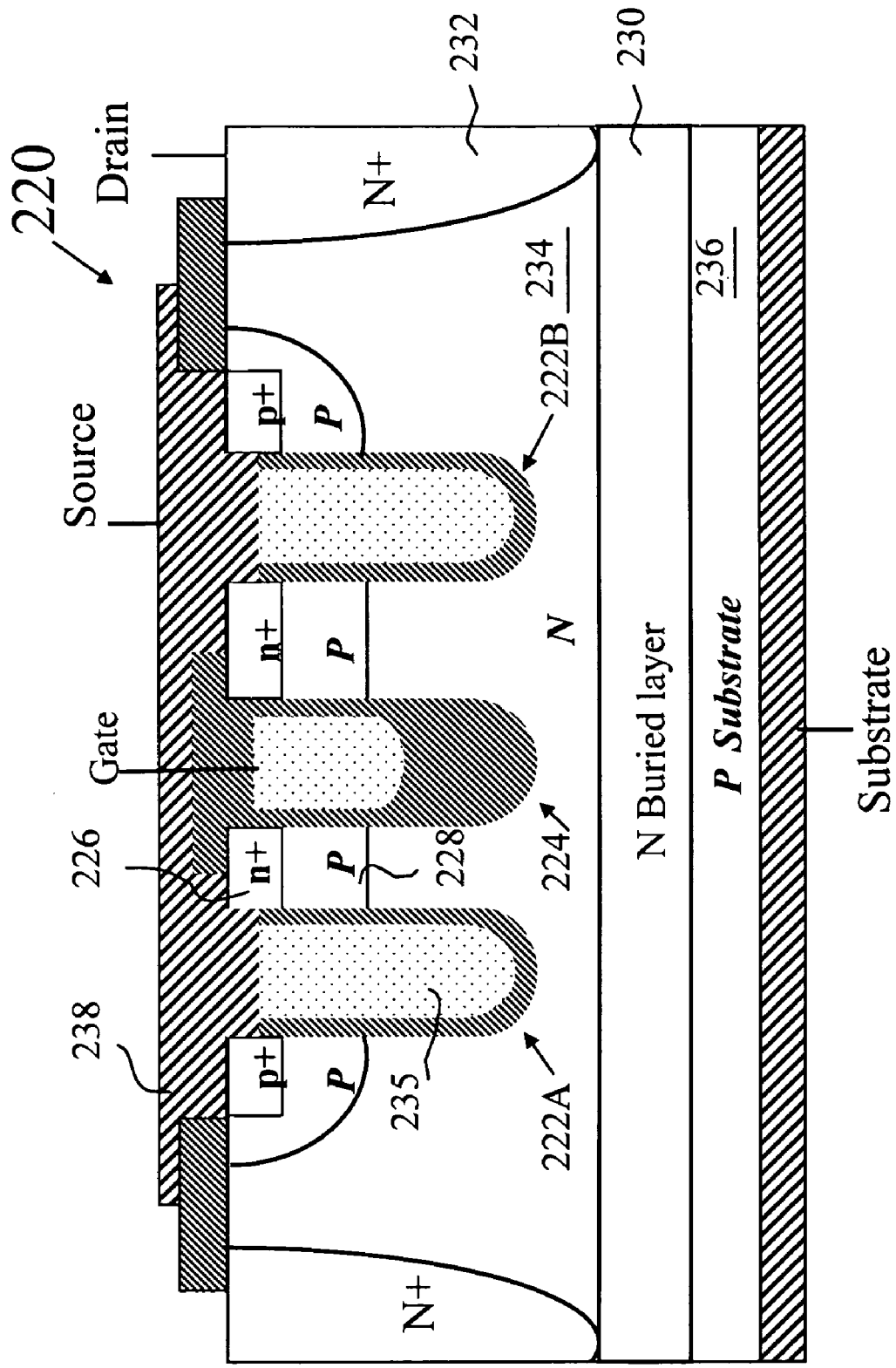
FIG. 20 is a cross-sectional view of a quasi-vertical MOSFET in accordance with the invention.

The principles of this invention are applicable to quasi-vertical as well as vertical MOSFETs. FIG. 20 is a cross-sectional view of a quasi-vertical MOSFET 220. MOSFET 220 includes a gate trench 224, RFP trenches 222A and 222B, n+ source regions 226 and p-body regions 228. An n-buried layer 230 is formed at the interface between a p-type substrate 236 and an n-epitaxial layer 234. N-buried layer 230 is contacted from the top surface of n-epitaxial layer 234 via n+ sinker regions 232. RFP electrodes 235 in RFP trenches 222A and 222B are contacted by a source contact layer 238. When MOSFET 220 is turned on, a current flows from n+ source regions 226, through p-body regions 228 to n-buried layer 230 and back up to the surface of n-epitaxial layer 234 via n+ sinker regions 232.

The embodiments described above are illustrative only and not limiting. Many additional and alternative embodiments in accordance with the broad principles of this invention will be obvious to persons of skill in the art from the above descriptions. For example, devices in accordance with this invention may be fabricated in various layouts, including "stripe" and "cellular" layouts. While the embodiments described above have generally been n-channel MOSFETs, the principles of this invention are equally applicable to p-channel MOSFETs. While the embodiments described above include an epitaxial layer grown on a substrate, in some embodiments the epitaxial layer may be omitted. It should also be noted that various combinations of the above embodiments can be realized and are included within the scope of this disclosure.

I claim:

1. A MOSFET formed in a semiconductor die comprising:

a gate trench extending from a surface of the die, the gate trench comprising a gate electrode, the gate electrode being insulated from the die by a first dielectric layer, the first dielectric layer comprising a first section at a bottom of the gate trench and a second section at a sidewall of the gate trench, the first section being thicker than the second section;

a first recessed field plate (RFP) trench extending from the surface of the die, the first RFP trench containing a first RFP electrode having an upper surface which is recessed below an upper surface of said gate electrode and which is insulated from the die by a second dielectric layer;

a second RFP trench extending from the surface of the die, the second RFP trench containing a second RFP electrode which is also insulated from the die, the gate trench being located between the first and second RFP trenches;

a mesa of the die between the gate trench and the first RFP trench;

a source region of a first conductivity type in the mesa adjacent to the surface of the die and a sidewall of the gate trench;

a body region, having a second conductivity type opposite to the first conductivity type, adjacent to the sidewall of the gate trench and to the source region;

a body contact region, abutting said first and second RFP trenches and said body region,
which is at least partly self-aligned to at least one of said RFP electrodes,
which is doped with said second conductivity type,
which has a doping concentration greater than that of said body region, and
which defines a bottom junction depth which is deeper than a bottom junction of said body region; and a drain-drift region of the first conductivity type adjacent to the body region;

wherein the respective bottoms of the first and second RFP electrodes are located at a level deeper below the surface of the die than a bottom of the gate electrode.

2. The MOSFET of claim 1, wherein the gate trench is equidistant from the first and second RFP trenches.

3. The MOSFET of claim 1, wherein a doping concentration of the drain-drift region in an area between the first RFP trench and the gate trench is less than a doping concentration of the drain-drift region in an area below the gate trench.

4. The MOSFET of claim 1, wherein the first and second RFP electrodes comprise polysilicon doped with a dopant of the first conductivity type.

5. The MOSFET of claim 1, wherein the first and second RFP electrodes comprise polysilicon doped with a dopant of the second conductivity type.

6. The MOSFET of claim 1, wherein said body contact region has a junction contour which corresponds to implantation and outdiffusion from ions introduced near the tops of said RFP electrodes.

7. The MOSFET of claim 1, further comprising metal plugs which overlie said RFP electrodes, and also a metal layer overlying said metal plugs.

8. The MOSFET of claim 1, wherein said first conductivity type is n type.

9. The MOSFET of claim 3, wherein said body contact region has a junction contour which corresponds to implantation and outdiffusion from ions introduced near the tops of said RFP electrodes.

10. The MOSFET of claim 3, further comprising metal plugs which overlie said RFP electrodes, and also a metal layer overlying said metal plugs.

11. The MOSFET of claim 3, wherein said first conductivity type is n type.

12. The MOSFET of claim 4, wherein said body contact region has a junction contour which corresponds to implantation and outdiffusion from ions introduced near the tops of said RFP electrodes.

13. The MOSFET of claim 4, further comprising metal plugs which overlie said RFP electrodes, and also a metal layer overlying said metal plugs.

14. The MOSFET of claim 4, wherein said first conductivity type is n type.

15. A MOSFET formed in a semiconductor die comprising:
a gate trench extending from a surface of the die, the gate trench comprising a gate electrode, the gate electrode being insulated from the die by a first dielectric layer, the first dielectric layer comprising a first section at a bottom of the gate trench and a second section at a sidewall of the gate trench, the first section being thicker than the second section;
a recessed field plate (RFP) trench extending from the surface of the die, the RFP trench containing an RFP electrode having an upper surface which is recessed below an upper surface of said gate electrode, the RFP electrode being insulated from the die by a second dielectric layer, a bottom of the RFP electrode being located at a level deeper below the surface of the die than a bottom of the gate electrode, the RFP electrode being electrically isolated from the gate electrode;
a mesa of the die between the gate trench and the RFP trench;
a source region of a first conductivity type in the mesa adjacent to the surface of the die, the source region extending across the mesa between a sidewall of the RFP trench and a sidewall of the gate trench;
a body region of a second conductivity type opposite to the first conductivity type in the mesa, the body region being adjacent to the source region;
a body contact region, abutting said RFP trench and said body region,
which is at least partly self-aligned to said RFP electrodes,
which is doped with said second conductivity type,
which has a doping concentration greater than that of said body region, and
which defines a bottom junction depth which is deeper than a bottom junction of said body region; and
a drain-drift region of the first conductivity type adjacent to the body region.

16. The MOSFET of claim 15, wherein a depth of the RFP trench is substantially equal to a depth of the gate trench.

17. The MOSFET of claim 15, comprising:
a second RFP trench extending from the surface of the die, the second RFP trench containing a second RFP electrode, the second RFP electrode being insulated from the die by a third dielectric layer, a bottom of the second RFP electrode being located at a level deeper below the surface of the die than a bottom of the gate electrode;
a second mesa of the die between the gate trench and the second RFP trench;
a second source region of the first conductivity type in the second mesa adjacent to the surface of the die, the second source region extending across the second mesa between a sidewall of the second RFP trench and a second sidewall of the gate trench;
a second body region of the second conductivity type in the mesa, the second body region being adjacent to the second source region and extending across the second mesa between the sidewall of the RFP trench and the second sidewall of the gate trench.

18. The MOSFET of claim 17, wherein a depth of each of the RFP trench and the second RFP trench is substantially equal to a depth of the gate trench.

19. The MOSFET of claim 15, wherein said body contact region has a junction contour which corresponds to implantation and outdiffusion from ions introduced near the tops of said RFP electrodes.

20. The MOSFET of claim 15, further comprising metal plugs which overlie said RFP electrodes, and also a metal layer overlying said metal plugs.

21. The MOSFET of claim 15, wherein said first conductivity type is n type.

22. The MOSFET of claim 16, wherein said body contact region has a junction contour which corresponds to implantation and outdiffusion from ions introduced near the tops of said RFP electrodes.

23. The MOSFET of claim 16, further comprising metal plugs which overlie said RFP electrodes, and also a metal layer overlying said metal plugs.

24. The MOSFET of claim 16, wherein said first conductivity type is n type.

25. The MOSFET of claim 17, wherein said body contact region has a junction contour which corresponds to implantation and outdiffusion from ions introduced near the tops of said RFP electrodes.

26. The MOSFET of claim 17, further comprising metal plugs which overlie said RFP electrodes, and also a metal layer overlying said metal plugs.

27. The MOSFET of claim 17, wherein said first conductivity type is n type.

* * * * *